(12) United States Patent
Nishioka et al.

(10) Patent No.: US 10,964,767 B2
(45) Date of Patent: Mar. 30, 2021

(54) ORGANIC EL DISPLAY DEVICE AND MANUFACTURING METHOD FOR ORGANIC EL DISPLAY DEVICE

(71) Applicant: SAKAI DISPLAY PRODUCTS CORPORATION, Sakai (JP)

(72) Inventors: Yukiya Nishioka, Sakai (JP); Katsuhiko Kishimoto, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 17/043,624

(22) PCT Filed: Apr. 11, 2018

(86) PCT No.: PCT/JP2018/015262
§ 371 (c)(1),
(2) Date: Sep. 29, 2020

(87) PCT Pub. No.: WO2019/198181
PCT Pub. Date: Oct. 17, 2019

(65) Prior Publication Data
US 2021/0020718 A1    Jan. 21, 2021

(51) Int. Cl.
*H01L 27/32* (2006.01)
*G09G 3/3225* (2016.01)
(Continued)

(52) U.S. Cl.
CPC ....... *H01L 27/3262* (2013.01); *G09G 3/3225* (2013.01); *H01L 27/3258* (2013.01);
(Continued)

(58) Field of Classification Search
None
See application file for complete search history.

(56) References Cited

U.S. PATENT DOCUMENTS 9,516,721 B2 *   12/2016   Morita .................. H05B 33/145
9,676,649 B2 *    6/2017   Dobbins ........... H01L 29/78603
(Continued)

FOREIGN PATENT DOCUMENTS

JP    2005-116524 A    4/2005
JP    2007-242895 A    9/2007
(Continued)

*Primary Examiner* — Vinh T Lam
(74) *Attorney, Agent, or Firm* — ScienBiziP, P.C.

(57) ABSTRACT

This organic-EL display apparatus comprises an organic-EL display panel including: a substrate that is provided with pixel drive circuits to drive respective pixels arranged in a matrix along each of a first direction and a second direction, and organic light-emitting elements being provided to each of the pixels and connected to any one of the pixel drive circuits. The organic-EL display panel comprises a signal output circuit to supply a signal to each of the pixel drive circuits arranged in a line along the first direction or the second direction. The signal output circuit includes thin film transistors and is formed around a display region on a surface of the substrate. The thin film transistors include a semiconductor layer including a region to be a channel between a source electrode and a drain electrode. The semiconductor layer is formed of amorphous silicon.

9 Claims, 14 Drawing Sheets

(51) Int. Cl.
  *G09G 3/3275* (2016.01)
  *H01L 27/12* (2006.01)
  *G09G 3/3266* (2016.01)

(52) U.S. Cl.
  CPC ......... *G09G 3/3266* (2013.01); *G09G 3/3275* (2013.01); *G09G 2300/0426* (2013.01); *H01L 27/1214* (2013.01); *H01L 2227/323* (2013.01)

(56) References Cited

U.S. PATENT DOCUMENTS

| | | |
|---|---|---|
| 2005/0095740 A1 | 5/2005 | Hirakata et al. |
| 2007/0210353 A1 | 9/2007 | Nagata et al. |
| 2008/0079685 A1 | 4/2008 | Umezaki et al. |
| 2010/0059820 A1* | 3/2010 | Ohmi ................ H01L 29/78639 257/347 |
| 2011/0168994 A1* | 7/2011 | Kawashima ........ C23C 14/3414 257/43 |
| 2011/0261019 A1* | 10/2011 | Makita ................ H01L 27/1229 345/175 |
| 2012/0049168 A1* | 3/2012 | Inbasekaran ........... H05B 33/14 257/40 |
| 2012/0187399 A1* | 7/2012 | Fukuda ............... H01L 51/0097 257/43 |
| 2012/0286250 A1* | 11/2012 | Yamamoto ........... H01L 51/5275 257/40 |
| 2012/0313055 A1* | 12/2012 | Yukinobu ............. C09D 11/101 252/519.5 |
| 2013/0168648 A1* | 7/2013 | Jeong .................. H01L 27/3246 257/40 |
| 2016/0020429 A1* | 1/2016 | Kuroki .................... H01L 51/56 257/40 |
| 2016/0027810 A1 | 1/2016 | Umezaki |
| 2016/0104734 A1 | 4/2016 | Hirose et al. |
| 2018/0040640 A1 | 2/2018 | Takahashi et al. |
| 2019/0081278 A1* | 3/2019 | Wittmann ........... H01L 51/5256 |
| 2019/0157627 A1* | 5/2019 | Bae ...................... H01L 27/3258 |
| 2020/0243630 A1* | 7/2020 | Kishimoto .......... H01L 27/3258 |

FOREIGN PATENT DOCUMENTS

| | | |
|---|---|---|
| JP | 2008-053526 A | 3/2008 |
| JP | 2008-089915 A | 4/2008 |
| JP | 2016-029797 A | 3/2016 |
| JP | 2016-153888 A | 8/2016 |
| JP | 2016-197704 A | 11/2016 |
| JP | 2017-011173 A | 1/2017 |
| JP | 2018-025777 A | 2/2018 |

* cited by examiner

ORGANIC EL DISPLAY DEVICE AND MANUFACTURING METHOD FOR ORGANIC EL DISPLAY DEVICE

TECHNICAL FIELD

The invention relates to an organic-EL display apparatus and a manufacturing method for an organic-EL display apparatus.

BACKGROUND ART

In recent years, an organic-EL display apparatus, application of which organic-EL display apparatus to a television receiver is making progress, comprises, for each pixel being arrayed in a matrix, an organic light-emitting element, and a drive circuit to cause the organic light-emitting element to emit light with a desired current. In this pixel drive circuit being configured mainly with a plurality of thin film transistors, a scanning signal (a gate signal) or a data signal (a source signal) is supplied from a signal output circuit called a gate driver or a source driver to any one of the plurality of thin film transistors. While the gate driver and the source driver are conventionally provided at the exterior of an organic-EL display panel, these drivers, particularly the gate driver, can also be provided on the organic-EL display panel. In that case, the gate driver to be provided on the organic-EL display panel can also be configured mainly with a thin film transistor. Patent Document 1 discloses forming a thin film transistor having the multilayer structure to reduce the occupied area of the thin film transistor in an active matrix-type display.

PRIOR ART DOCUMENT

Patent Document

Patent Document 1: JP 2017-011173 A

SUMMARY OF THE INVENTION

Problem to be Solved by the Invention

In an organic-EL display apparatus, an organic light-emitting element is a current-driven light-emitting element, so that a higher current supplying capability (drive capability) for a pixel drive circuit therein is required compared to that in a liquid crystal display apparatus. Moreover, a sufficient drive capability to allow rapid charging/discharging of a gate capacitance, for example, is also required for a signal output circuit such as a gate driver to supply a gate signal to the pixel drive circuit. The necessity of such a high drive capability is believed to further increase as the diffusion of organic-EL display apparatuses progresses as large-sized televisions. Moreover, as the screen increases in size, luminance non-uniformity or color non-uniformity (below "luminance non-uniformity" and/or color non-uniformity" are also collectively called "display non-uniformity") easily stands out, so that, for the diffusion of the organic-EL display apparatuses for the large-sized televisions, further suppression of such a display non-uniformity is also required. Moreover, to accelerate the diffusion of organic-EL display apparatuses, a substantial reduction in manufacturing cost is also desired.

Thus, an object of the invention is to provide an organic-EL display apparatus that makes it possible to suppress display non-uniformity with the structure even making it possible to obtain a sufficient drive capability of a signal output circuit such as a gate driver and, even more, can be manufactured at low cost. Moreover, another object of the invention is to provide a manufacturing method that can manufacture, at low cost, an organic-EL display apparatus having small display non-uniformity, the organic-EL display apparatus comprising a signal output circuit that can have such a sufficient drive capability.

Means to Solve the Problem

An organic-EL display apparatus according to a first embodiment of the present invention comprises, an organic-EL display panel comprising a substrate and an organic light-emitting element, wherein a plurality of pixel drive circuits to drive a plurality of pixels respectively is provided on a surface of the substrate, the plurality of pixels being arrayed in a matrix along each of a first direction and a second direction being substantially orthogonal to each other, and the organic light-emitting element is provided in each one of the plurality of pixels and connected to any one of the plurality of pixel drive circuits; wherein the organic-EL display panel comprises a signal output circuit to supply a signal substantially simultaneously to each of pixel drive circuits being lined up along the first direction or the second direction in the plurality of pixel drive circuits; the signal output circuit comprises a plurality of thin film transistors and is formed at a periphery of a display region on the surface of the substrate; the thin film transistor comprises a gate electrode, a source electrode, a drain electrode, and a semiconductor layer comprising a region to be a channel between the source electrode and the drain electrode, and the semiconductor layer is formed with amorphous silicon.

A manufacturing method for an organic-EL display apparatus according to a second embodiment of the present invention comprises, forming a plurality of thin film transistors and a wiring on a substrate to form a plurality of pixel drive circuits to drive a plurality of pixels respectively, wherein the plurality of pixels is arrayed in a matrix in an organic-EL display panel; forming an insulating layer to cover at least a surface of the pixel drive circuit, and forming an organic light-emitting element on a surface of the insulating layer so as to be connected to the pixel drive circuit via a metal to penetrate the insulating layer, wherein a plurality of thin film transistors is formed at an edge part of the substrate along with forming of the pixel drive circuit, thereby forming a signal output circuit to supply a signal substantially simultaneously to each of pixel drive circuits being lined up in the plurality of pixel drive circuits; a thin film transistor making up the pixel drive circuit and a thin film transistor making up the signal output circuit are formed by forming a gate electrode, a gate insulating layer, a drain electrode and a source electrode, and a semiconductor layer comprising a region to be a channel between the drain electrode and the source electrode, and the semiconductor layer is formed with amorphous silicon.

Effects of the Invention

A first embodiment of the present invention makes it possible to suppress display non-uniformity of an organic-EL display apparatus with the structure even making it possible to obtain a sufficient drive capability of a signal output circuit and makes it possible to reduce cost in manufacturing the organic-EL display apparatus. Moreover, a second embodiment of the invention makes it possible to manufacture, at low cost, an organic-EL display apparatus having small display non-uniformity, the organic-EL display apparatus comprising a signal output circuit that can have such a sufficient drive capability.

EMBODIMENT FOR CARRYING OUT THE INVENTION

Figure 1:
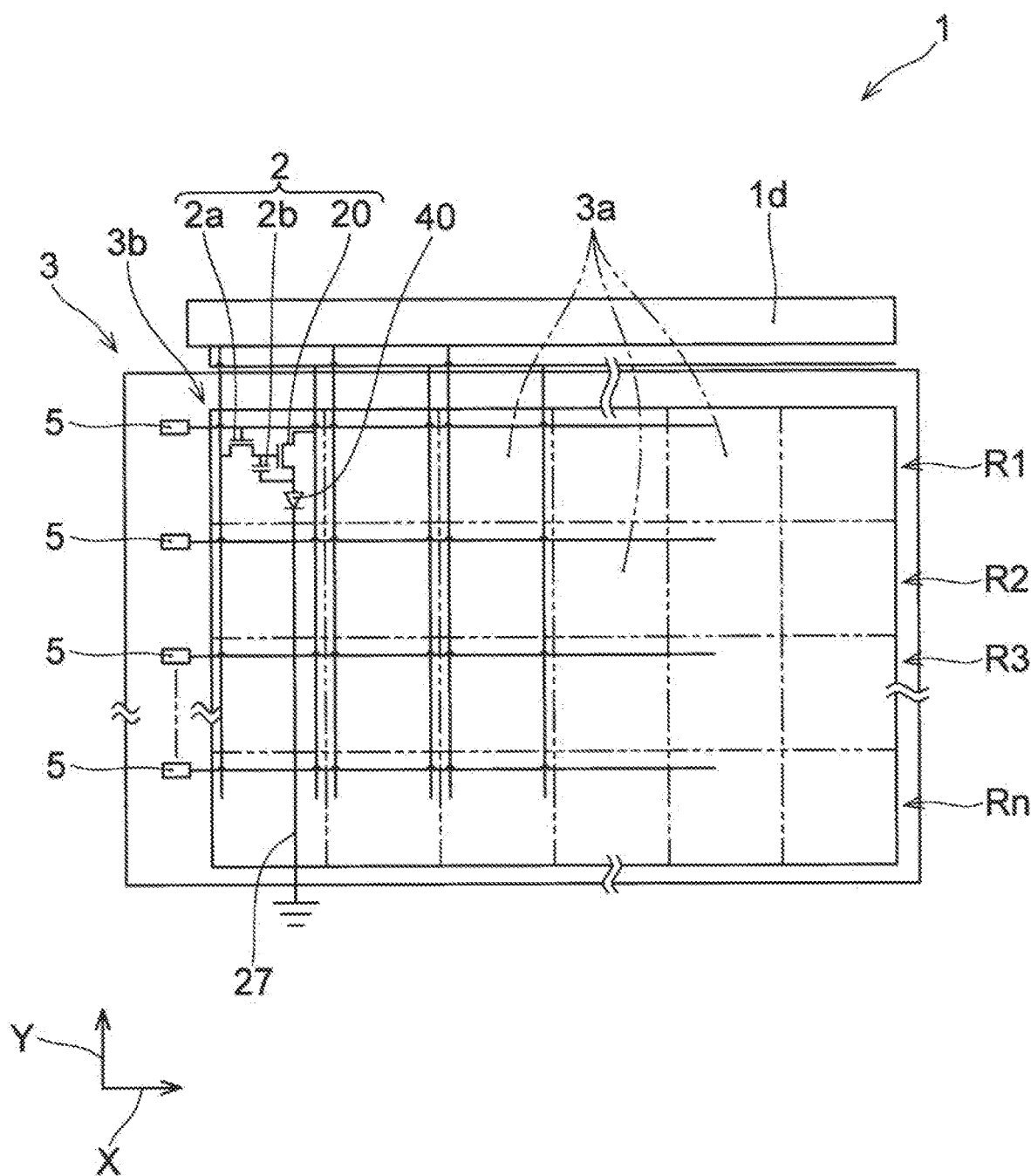
FIG. 1 schematically shows a view of one example of the configuration of an organic-EL display apparatus according to one embodiment of the present invention.

The inventors have made intensive studies to suppress display non-uniformity of an organic-EL display apparatus and have found that a part of the display non-uniformity is caused by variations in the characteristics of a signal output circuit such as a gate driver to supply a signal to a pixel drive circuit. In other words, variations occurring in the characteristics of a thin film transistor, such as a gate threshold voltage or a maximum drain current, has been found, the thin film transistor making up a gate driver being formed on the organic-EL display panel as described previously. Then, the inventors have found that such variations cause variations on the ON state of a drive transistor in the pixel drive circuit, causing, as a result, variations in luminance of an organic light-emitting element and, moreover, variations in chromaticity along with variations in luminance between each sub-pixel.

Thus, the inventors have further made studies on a method for suppressing these variations in the characteristics of the thin film transistor. A semiconductor layer to be a channel of the thin film transistor to be formed on the organic-EL display panel is formed with low-temperature polycrystalline silicon (LTPS) being superior in carrier mobility. The semiconductor layer being formed with LTPS is generally formed by, first, forming a semiconductor layer being formed with amorphous silicon and carrying out annealing by irradiation of excimer laser light (ELA) on the semiconductor layer. Regions of the semiconductor layer other than portions to be a channel, a source, or a drain are removed by etching. The degree of poly-crystallization of amorphous silicon by the ELA varies in accordance with the irradiation condition of the excimer laser light. However, as it is extremely difficult to uniformly irradiate the laser light, variations in the characteristics of the thin film transistor to be formed on the organic-EL display panel due to the difference in the degree of poly-crystallization, or, in other words, the difference in carrier mobility of each channel can occur as a result of non-uniformity of the irradiation condition. The inventors have found that the variations in the characteristics of the thin film transistor caused by the ELA process is a cause of display non-uniformity and have further found that this semiconductor layer can be formed not with LTPS, but with amorphous silicon and that, in this way, the display non-uniformity of the organic-EL display apparatus can be suppressed. In other words, the inventors have found that the semiconductor layer to function adequately in the thin film transistor making up the signal output circuit can be formed not with LTPS, but with amorphous silicon. Amorphous silicon, not undergoing the ELA process, has extremely small variations in carrier mobility, making it possible to decrease variations in the characteristics of the thin film transistor and, in turn, to decrease variations in display non-uniformity.

The inventors have found that the gate driver can be formed at the edge of the organic-EL display panel using amorphous silicon instead of LTPS specifically by making the channel width of the thin film transistor much longer than the channel length thereof or providing a large number of thin film transistors, for example. In particular, if amorphous silicon is used, even when a large number of thin film transistors are provided, a problem due to variations in the characteristics among the plurality of thin film transistors seldom occurs. Moreover, while an increase in the number of thin film transistors using LTPS in a case that capability enhancement of the gate driver, for example, is further called for with upsizing of a screen can cause variations in the characteristics to be problematic, such a problem is unlikely to occur in a case of the thin film transistor using amorphous silicon. In this way, even from the viewpoint of dealing with upsizing of the screen, it is meaningful to use amorphous silicon for a thin film transistor on the organic-EL display panel.

Moreover, the previously-described ELA makes the manufacturing process of the organic-EL display apparatus complex and also prevents reduction in manufacturing cost. In addition, facilities required for the ELA is extremely expensive and, even more, the feasibility of facilities to be applicable to mother substrates such as those beyond the 10$^{th}$ generation, as already introduced in the manufacturing line of a liquid crystal display apparatus is not foreseen. The use of amorphous silicon for the semiconductor layer of the thin film transistor to be formed on the organic-EL display panel causes such an ELA process to be unnecessary. In other words, the trend for upsizing of the screen can be followed without any major obstacles and simplification of manufacturing of the organic-EL display apparatus and reduction in manufacturing cost thereof can also be realized.

Below, with reference to the drawings, an organic-EL display apparatus and a manufacturing method for an organic-EL display apparatus according to embodiments of the present invention are explained. Material and shape of individual constituting elements and relative positional relationships among them according to embodiments to be explained below are merely exemplary, so that the organic-EL display apparatus and the manufacturing method for the organic-EL display apparatus are construed to be not limited thereto.

[Organic-EL Display Apparatus]

Figure 2:
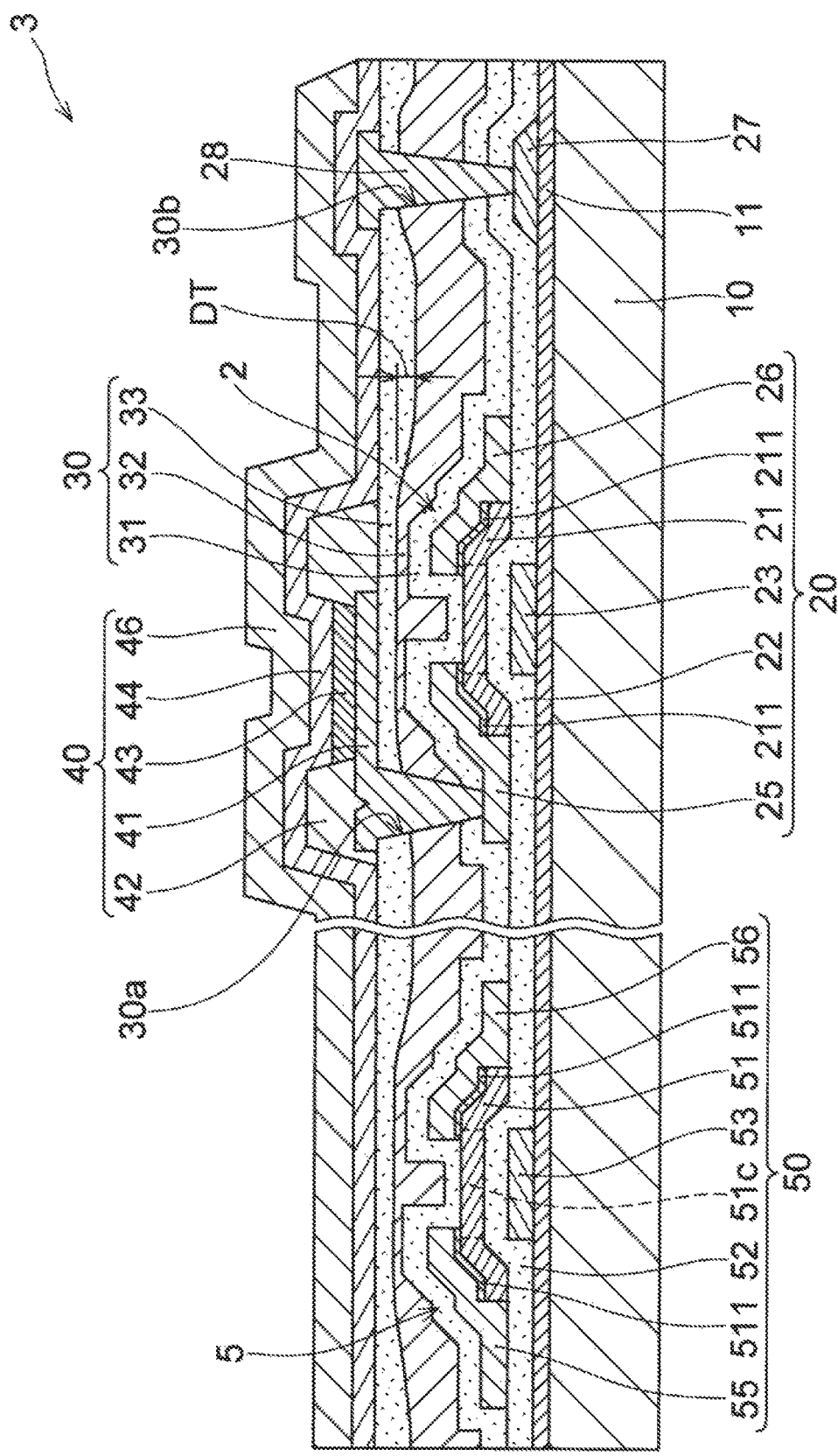
FIG. 2 shows a cross-sectional view of one example of a display panel of the organic-EL display apparatus according to one embodiment.

FIG. 1 schematically shows one example of the configuration of an organic-EL display apparatus 1 according to a first embodiment. FIG. 2 shows one example of a partial cross-section of an organic display panel 3 to be provided in the organic-EL display apparatus 1. As shown in FIGS. 1 and 2, the organic-EL display apparatus 1 comprises the organic-EL display panel 3 comprising a substrate 10 and an organic light-emitting element 40, on a surface of which substrate 10 a plurality of pixel drive circuits 2 each one of which drives each one of a plurality of pixels 3a, and the organic light-emitting element 40 being provided in each one of the plurality of pixels 3a and being connected to any one of the plurality of pixel drive circuits 2. The plurality of pixels 3a is arrayed in a matrix along each of a first direction (for example, X direction in FIG. 1, below called "a first direction X") and a second direction (for example, Y direction in FIG. 1, below called "a second direction Y"), the first direction and the second direction being substantially orthogonal to each other. The organic-EL display panel 3 further comprises a signal output circuit 5 to supply a signal substantially simultaneously to each one of the plurality of pixel drive circuits 2 being lined up along the first direction X or the second direction Y. In the example shown in FIG. 1, the signal output circuit 5 is connected to each one of the plurality of pixel drive circuits 2 being lined up along the first direction X and supplies a signal substantially simultaneously to each one of the plurality of pixel drive circuits 2 being lined up along the first direction X. The signal output circuit 5 is formed at a periphery of a display region 3b on a surface of the substrate 10, on which the pixel drive circuits 2 are provided. In the example in FIG. 1, the plurality of signal output circuit 5 is formed at the edge part along one side (the left side in the example in FIG. 1) of two sides opposing each other in the first direction X of the organic-EL display panel 3 and the signal output circuit 5 are arranged along this one side. Moreover, the organic-EL display apparatus 1 in the example in FIG. 1 comprises an emission driver 1d being also called a source driver at the exterior of the organic-EL display panel 3.

The pixel drive circuit 2 comprises a current control transistor 20 (below also called a first pixel TFT 20) being configured with a thin film transistor (TFT) and connected to the organic light-emitting element 40. The first pixel TFT 20 causes the current conduction state of the organic light-emitting element 40 to be switched. The pixel drive circuit 2 further comprises a switching transistor 2a (below also called a second pixel TFT 2a) to switch on/off of the first pixel TFT 20 and a storage capacitance 2b to hold the gate-source voltage of the first pixel TFT 20. The source of the first pixel TFT 20 is connected to the anode of the organic light-emitting element 40, while the cathode of the organic light-emitting element 40 is connected to the ground via a cathode wiring 27. As a scanning line signal (a gate signal) is sent to the second pixel TFT 2a from the signal output circuit 5, a data signal of a display image is applied to the gate of the first pixel TFT 20 via the second pixel TFT 2a from the emission driver 1d, and the organic light-emitting element 40 emits light with a predetermined luminance based on the voltage of the data signal. While the "pixel" as referred to in the above and the following explanations and in each of the drawings is a minimum constituting element (a unit element) of a display screen and is "a sub-pixel" to be accurate, it is also called the "pixel" for brevity of explanations. Moreover, the "surface" in the following explanations means a surface oriented in a direction being opposite to the substrate 10 in each constituting element other than the substrate 10 that makes up the organic-EL display apparatus 1 in a case that the distinction thereof is not recited therein in particular. The "surface" with respect to the substrate 10 means a surface being oriented to the organic light-emitting element 40.

In the example in FIG. 1, the signal output circuit 5 is a drive circuit being also called a gate driver, a scanning line driver, or a scan driver and supplies a scanning line signal (a gate signal) of the organic-EL display panel 3 to the gate of the second pixel TFT 2a of the pixel drive circuit 2. The signal output circuit 5 comprises a plurality of thin film transistors 50 (While only one thin film transistor 50 is shown in FIG. 2, thirteen TFTs 50a to 50m are included in the example in FIG. 4B to be referred to below, for example.) Below, the thin film transistor 50 included in the signal input circuit 5 is called the "drive TFT 50" (or drive TFTs 50a to 50m) for the purpose of distinguishing it from the first and second pixel TFTs 20, 2a, or is also called merely the "TFT 50" (or TFTs 50a to 50m). Unlike the example in FIG. 1, the signal output circuit 5 can be a drive circuit to supply a signal substantially simultaneously to each of the pixel drive circuits 2 being lined up along the second direction Y. Then, the signal output circuit 5 can be an emission driver (a source driver or a data line driver) to supply a data signal of a display image to each of the pixel drive circuits 2 being lined up along the first direction X or the second direction Y.

As shown in FIG. 2, the TFT 50 comprises a gate electrode 53, a source electrode 55, a drain electrode 56, and a semiconductor layer 51 comprising a region 51c to be a channel between the source electrode 55 and the drain electrode 56. In the example in FIG. 2, a second semiconductor layer 511 consisting of a semiconductor having a high impurities concentration is provided between the drain electrode 56 and the source electrode 55, and the semiconductor layer 51. The channel is formed, by application of a predetermined voltage to the gate electrode 53, mainly at a region 51c in the semiconductor layer 51, the region 51c being a region between the drain electrode 56 and the source electrode 55 and overlapping with the gate electrode 53. In the organic-EL display apparatus 1 according to the present embodiment, the semiconductor layer 51 is formed with amorphous silicon.

In this way, in the organic-EL display apparatus 1 in the present embodiment, the semiconductor layer 51 of the TFT 50 making up the signal output circuit 5 to function as a scan driver, for example, is formed with amorphous silicon. Therefore, variations in the characteristics of the TFT 50 are small and, therefore, even in a case that the signal output circuit 5 is provided in a plurality, variations in the characteristics between the individual signal output circuits 5 are small. Therefore, variations not intended are unlikely to occur in the ON state of the first pixel TFT 20 in the pixel drive circuit 2. Therefore, display non-uniformity of the organic-EL display panel 1 can be reduced. Moreover, even in a case that improvement in the drive capability of the signal output circuit 5 is further called for, the drive capability can be enhanced by increasing the number of TFTs 50 (for example, providing the plurality of TFTs 50 being connected in parallel) substantially without causing a problem to occur due to variations in the characteristics between the individual TFTs 50. Moreover, even if the number of TFTs 50 is increased in such a manner, the yield never substantially decreases because of the characteristics of the TFT 50 being stable.

Moreover, the previously-described ELA process becomes unnecessary in forming the signal output circuit 5 to function as the scan driver, so that at least the forming process of the signal output circuit 5 can be simplified. Then, as described below, the first and second TFTs 20, 2a in the pixel drive circuit 2 also can be configured to have a structure using amorphous silicon to preclude the ELA process from the manufacturing process of the organic-EL display apparatus 1. In other words, the substrate 10 comprising a plurality of TFTs (the drive TFT 50 and the first pixel TFT 20) and being referred to as a so-called backplane can be easily and inexpensively formed without using expensive facilities and, even more, upsizing of the mother substrate can be dealt with existing facilities. Moreover, a display non-uniformity compensation circuit that can be needed in the conventional organic-EL display apparatus becomes unnecessary, making it possible to contribute to reduction in cost of the organic-EL display apparatus even from such a viewpoint.

As shown in FIG. 2, in the same manner as the drive TFT 50, the first pixel TFT 20 of the pixel drive circuit 2 comprises a gate electrode 23, a drain electrode 26, a source electrode 25, and a semiconductor layer 21 comprising a region to be a channel. In the example in FIG. 2, a second semiconductor layer 211 consisting of a semiconductor having a high impurities concentration is provided between the drain electrode 26 and the source electrode 25, and the semiconductor layer 21. The channel is formed in a region of the semiconductor layer 21, the region overlapping with the gate electrode 23. Preferably, in all the thin film transistors including the first pixel TFT 20 (a current control transistor), the thin film transistors making up the pixel drive circuit 2, the semiconductor layer 21 in which the channel is formed is formed with amorphous silicon. In that case, as described previously, the ELA process can be precluded from the manufacturing process of the organic-EL display apparatus 1, making it possible to manufacture the backplane of the organic-EL display apparatus 1 easily and inexpensively. For example, the manufacturing line for the backplane of a liquid crystal display panel, in which the thin film transistor to be provided in each pixel is mainly formed with amorphous silicon, can also be transferred or shared for use as the manufacturing line of the backplane of the organic-EL display panel. In other words, upsizing of a screen can be dealt with while suppressing new facilities investment. While the second pixel TFT 2a of the pixel drive circuit 2 is not shown in FIG. 2, the second pixel TFT 2a also has the same structure as that of the first pixel TFT 20. While the semiconductor layer 21 of the first and second pixel TFTs 20, 2a can be formed with LTPS, the semiconductor layer 21 is preferably formed with amorphous silicon, as described previously.

Figure 3:
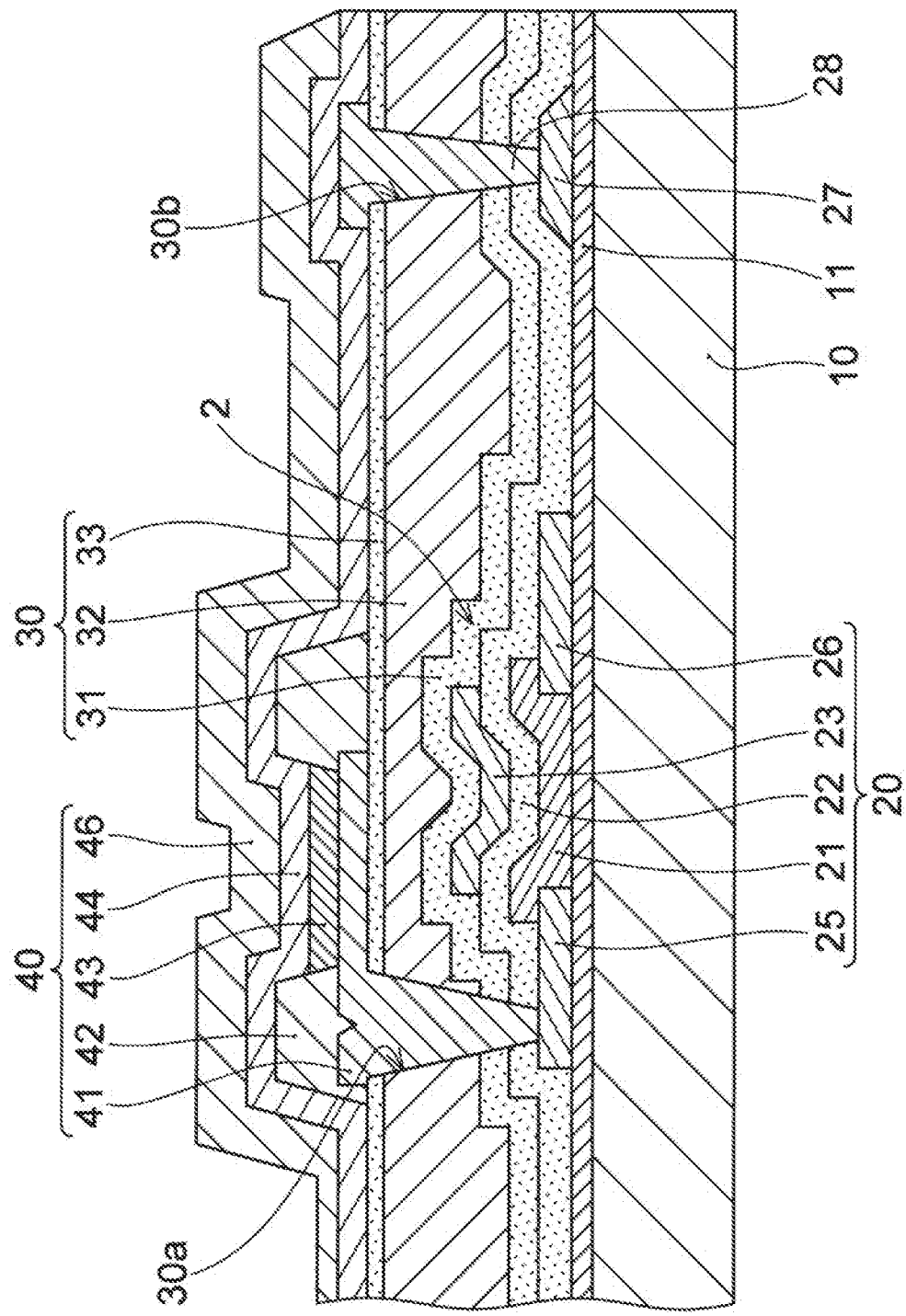
FIG. 3 shows a cross-sectional view of another example of one pixel and the surroundings thereof of the organic-EL display apparatus according to one embodiment.

FIG. 2 shows an example of the bottom gate structure (reverse-staggered structure) in which the gate electrodes 23, 53 are arranged between the substrate 10 and the semiconductor layers 21, 51 of the first pixel TFT 20 and the drive TFT 50. However, each TFT making up the pixel drive circuit 2 and the signal output circuit 5 can have the so-called top gate structure (staggered structure) as shown in FIG. 3. While the drive TFT 50 is omitted in FIG. 3, the drive TFT 50 can also have the structure being the same as that of the first pixel TFT 20 shown in FIG. 3. In the example in FIG. 3, the drain electrode 26 and the source electrode 25 are formed on a base coat layer 11 and the semiconductor layer 21 is deposited on the base coat layer 11 between the drain electrode 26 and the source electrode 25 so as to overlap with a part of each of the drain electrode 26 and the source electrode 25. The gate insulating layer 22 is deposited on the semiconductor layer 21, while the gate electrode 23 is formed on the gate insulating layer 22. The differences between the examples shown in FIGS. 2 and 3 are merely the vertical relationship among constituting elements in the first pixel TFT 20 and the state of the surface of the organic insulating layer 32 as described below. In FIGS. 2 and 3, the same reference numerals are affixed to constituting elements having the same functions, so that repeated explanations thereof will be omitted.

As shown in FIGS. 2 and 3, the organic-EL display panel 3 further comprises a planarizing layer 30 to planarize the surface of the substrate 10 by covering at least the pixel drive circuit 2 therewith, and an organic light-emitting element 40 is formed on a surface of the planarizing layer 30 facing to an opposite orientation from the pixel drive circuit 2. In the examples in FIGS. 2 and 3, the organic light-emitting element 40 is a top emission-type (TE-type) organic light-emitting diode and comprises a first electrode 41 (for example, an anode) being formed on the planarizing layer 30, an insulating bank 42 surrounding the first electrode 41, an organic light-emitting layer 43 being formed inside the insulating bank 42, and a second electrode 44 (for example, a cathode) being formed in the entirety of the substrate 10 including the positions on the organic light-emitting layer 43. In the examples in FIGS. 2 and 3, the source electrode 25 of the first pixel TFT 20 is connected to the first electrode 41 of the organic light-emitting element 40. Moreover, the second electrode 44 of the organic light-emitting element 40 is connected to a cathode wiring 27 via a cathode contact 28.

In a case that the organic light-emitting element 40 is of the TE-type as in the examples in FIGS. 2 and 3, the first pixel TFT 20 can be formed in the underlayer (between the first electrode 41 and the substrate 10) of a light-emitting region of the organic light-emitting element 40, or, in other words, a region in which the organic light-emitting layer 43 is formed such that the first pixel TFT 20 overlaps a part or all of the light-emitting region. In that case, the first pixel TFT 20 that can allow a large current to flow therethrough can be formed. Unlike the example in FIG. 2, the organic light-emitting element 40 can be of the bottom emission-type (BE-type) in which light emitted in the organic light-emitting layer 43 is radiated through the substrate 10. In that case, the pixel drive circuit 2 including the first pixel TFT 20 is preferably formed at the peripheral edge part of the light-emitting region or at the exterior of the light-emitting region.

Figure 4A:
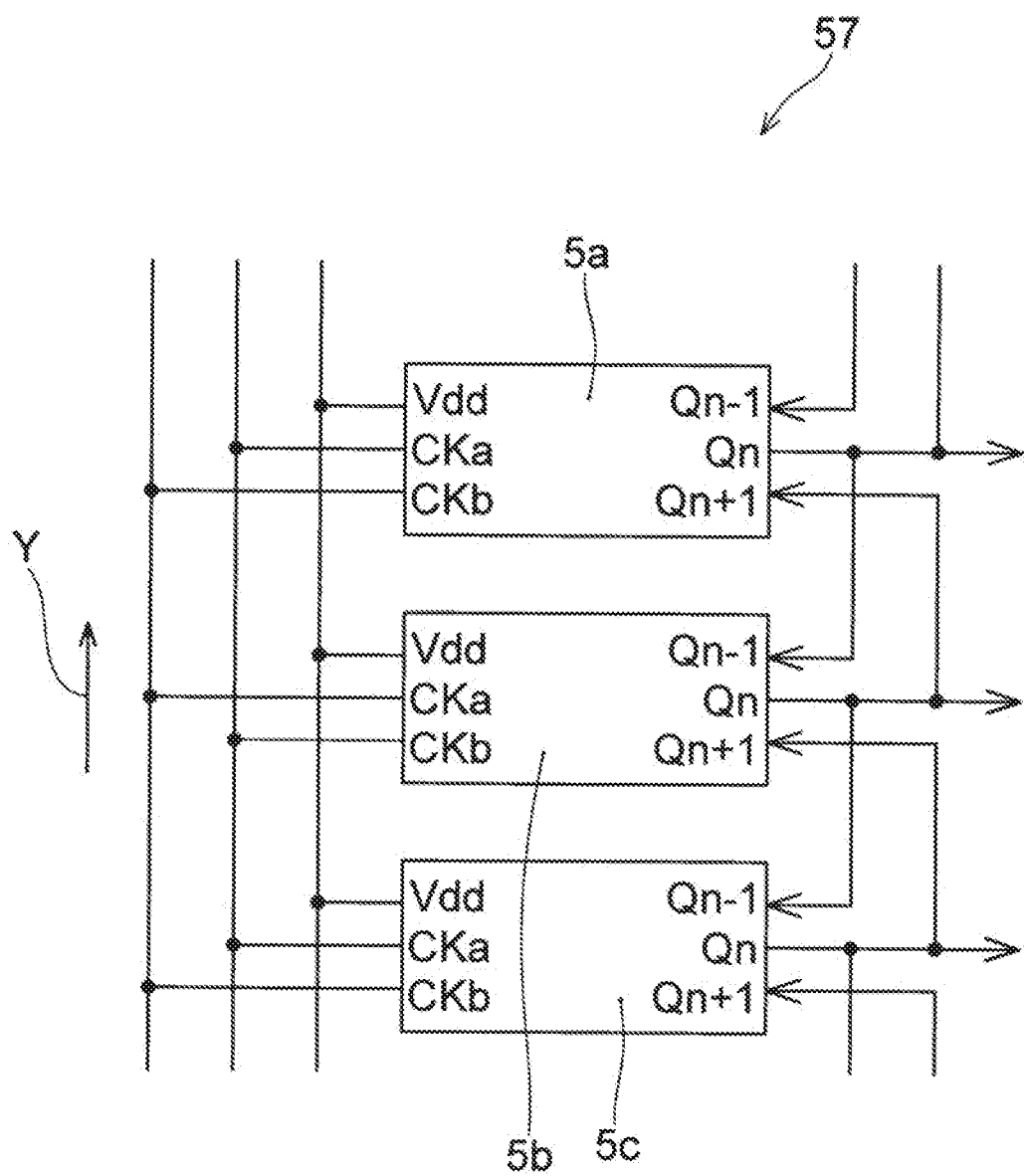
FIG. 4A shows a block diagram of one example of a shift register that the organic-EL display apparatus according to one embodiment can comprise.

As described previously, in the example in FIG. 1 previously referred to, the signal output circuit 5 is a scan driver to supply a scanning line signal to the pixel drive circuit 2. In that case, the signal output circuit 5 to be provided in a plurality can be connected to a control circuit (not shown) such as a timing controller, for example, so as to receive, in an individually independent manner, a timing signal (a clock) to indicate the output timing of the scanning line signal from the control circuit. However, as shown in FIG. 4A, a shift register 57 can be formed by connecting two or more signal output circuits 5a, 5b, 5c formed so as to line up substantially in parallel with a predetermined direction (the second direction Y in FIG. 4A). The shift register 57 outputs a scanning line signal, in order, to each of groups of the plurality of pixel drive circuits 2, the groups being lined up, in parallel with one another, along a direction in which the plurality of signal output circuits 5a to 5c are lined up (each of the groups consisting of a plurality of pixel drive circuits 2 being arrayed in each of a topmost row R1 to a bottommost row Rn being lined up, in parallel with one another, along the second direction Y in FIG. 1). Thanks to forming the shift register 57, it can be possible to simplify the process in the control circuit (not shown), and/or to reduce the number of wirings between the control circuit and the organic-EL display panel 3.

In the example in FIG. 4A, a power supply voltage is applied to Vdd of the signal output circuits 5a to 5c and a scanning line signal is output to each group of pixel drive circuits 2 (see FIG. 1) from $Q_n$. $Q_{n-1}$ of the signal output circuit 5b is connected to $Q_n$ of the signal output circuit 5a in the previous stage and $Q_{n+1}$ of the signal output circuit 5b is connected to $Q_n$ of the signal output circuit 5c in the subsequent stage. A clock signal is input to each of CKa and CKb of the signal output circuits 5a to Sc. In accordance with the clock signal and the input signal from the previous stage or the subsequent stage, a scanning line signal is output from the individual signal output circuits 5a to 5c, in order, along the second direction Y, for example. FIG. 4A is merely one example of the shift register 57 formed by the plurality of signal output circuits 5a to Sc, so that the configuration of the shift register 57 is construed to be not limited to the example in FIG. 4A. Moreover, the plurality of signal output circuits Sa to 5c can be lined up substantially parallel with the first direction X (see FIG. 1) and, furthermore, the shift register 57 can be configured with an arbitrary number of signal output circuits 5a to 5n (not shown), the arbitrary number being other than three.

Figure 4B:
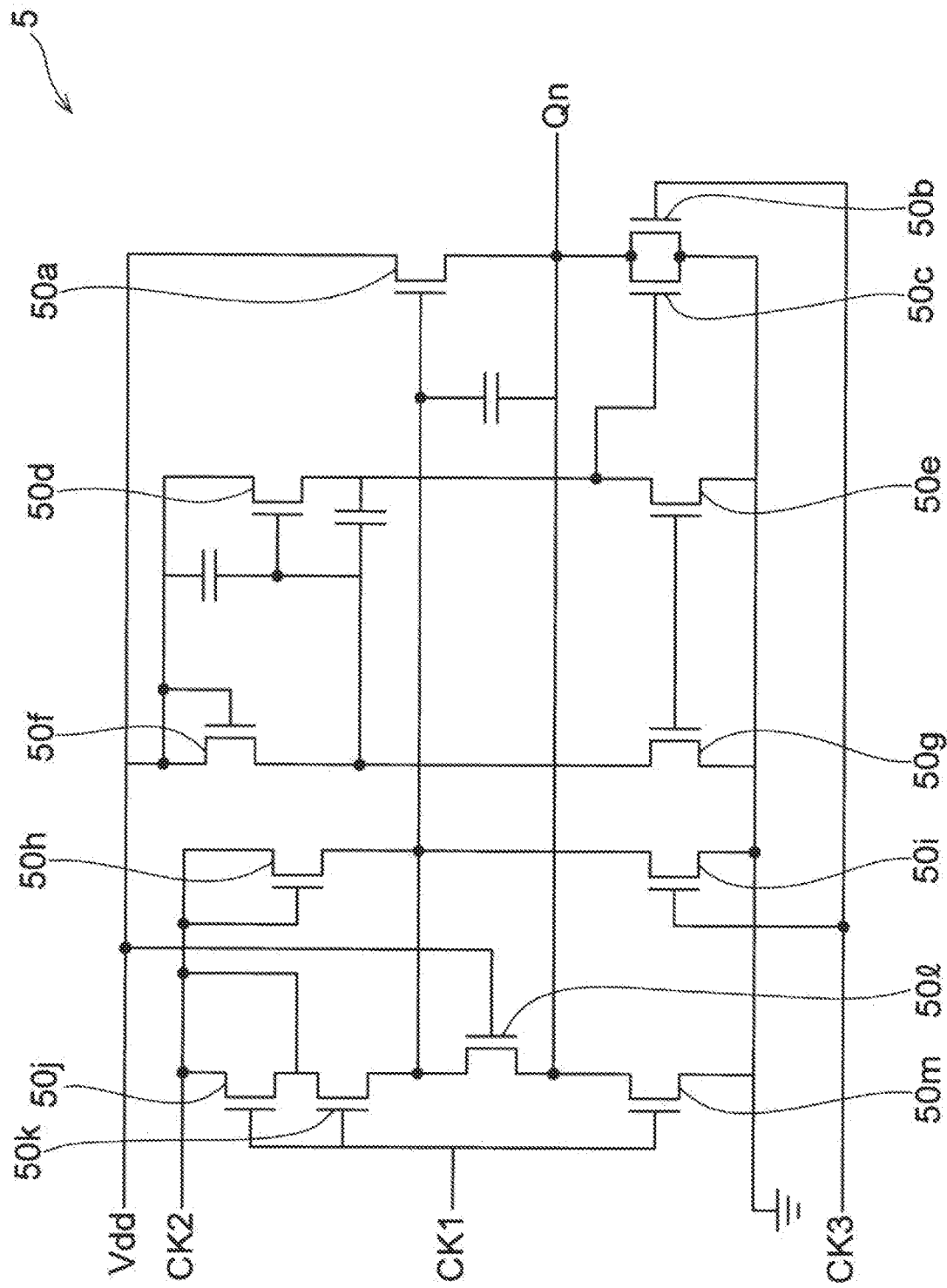
FIG. 4B shows a circuit diagram of an example of a signal output circuit of the organic-EL display apparatus according to one embodiment.

FIG. 4B shows one example of an internal circuit of the signal output circuit 5 (the signal output circuit 5 shown in FIG. 4B does not necessarily correspond to the signal output circuits 5a to 5c shown in FIG. 4A). In FIG. 4B, a power supply voltage is applied to Vdd, and a scanning line signal is output from an output $Q_n$ based on the input such as a clock signal to CK1 to CK3. While not shown, in a case that the previously-described shift register 57 is configured, the output $Q_n$ is connected to the signal output circuits 5 in the previous stage and in the subsequent stage. The signal output circuit 5 being exemplified in FIG. 4B is configured with thirteen thin film transistors TFT 50a to TFT 50m. The drive capability (current supplying capability or current sucking capability) of the signal output circuit 5 is influenced by the current rating of the TFT 50a to TFT 50c being connected to the output $Q_n$, for example. To obtain the capability necessary for appropriately driving the pixel drive circuit 2 (see FIG. 1), the TFT 50a, for example, can be formed with a plurality of thin film transistors, or can be formed so as to have a channel having the channel width being extremely long relative to the channel length, for example. The inventors have found that, by forming the thin film transistor in this way, for example, the signal output circuit 5 having the capability in which the pixel drive circuit 2 can be appropriately driven can be provided on the organic-EL display panel 3 (see FIG. 2) using amorphous silicon.

Describing in detail, conventionally the electron mobility of LTPS being used for a thin film transistor making up a gate driver is less than or equal to approximately 100 cm$^2$/Vs, and, on the other hand, the electron mobility of amorphous silicon is approximately 0.5 cm$^2$/Vs. Therefore, the drive TFT 50 can be provided such that it can compensate for the difference being 200 times in electron mobility. For example, the drive TFT 50 (the TFT 50a in the example in FIG. 4B) to be provided at the output ($Q_n$ in the example in FIG. 4B) of the signal output circuit 5 can be formed such that the W/L ratio being the ratio of the channel width (W) to the channel length (L) of the channel thereof is approximately 200 times greater than the W/L ratio of a channel by LTPS. Moreover, the difference in electron mobility can be compensated for by providing a large number of drive TFTs 50a without increasing the W/L ratio of the channel. However, providing some 200 of thin film transistors is difficult, considering also a wiring region for mutual connection, so that it is preferable to combine improving of the W/L ratio of the channel and making the number of thin film transistors large. For example, approximately ten thin film transistors can be laid out not so inefficiently even including a wiring for mutual connection. In that case, the difference in electron mobility can be compensated for merely by increasing the W/L ratio of the channel of the drive TFT 50a relative to the W/L ratio of the channel by LTPS being currently put into practice (for example, approximately 2.5) by approximately 20 times. Therefore, in at least one of the plurality of drive TFTs 50 making up the signal output circuit 5, the ratio (W/L) of the channel width (W) to the channel length (L) of the channel is preferably greater than or equal to 50 and less than or equal to 500.

As described previously, preferably, the first and second pixel TFTs 20, 2a in the pixel drive circuit 2 are also formed with amorphous silicon. However, it is required that these first and second pixel TFTs 20, 2a also have a necessary and sufficient current rating. In particular, it is required that the first pixel TFT 20 has a current rating to allow the organic light-emitting element 40 to be driven. Here, while LTPS has the electron mobility of approximately 100 cm$^2$/Vs as described previously, the electron mobility in the semiconductor layer being actually required to drive the organic light-emitting element in the organic-EL display apparatus is approximately 10 cm$^2$/Vs in a case of the W/L ratio in the current LTPS as described previously. Therefore, to use amorphous silicon having the electron mobility of approximately 0.5 cm$^2$/Vs for the semiconductor layer 21 of the first pixel TFT 20 in the pixel drive circuit 2, it suffices to increase the W/L ratio relative to the current W/L ratio (approximately 2.5, for example) by approximately 20 times. Therefore, preferably, the ratio (W1/L1) between the channel width (W1) and the channel length (L1) of the channel in the first pixel TFT 20 (current control transistor) is also greater than or equal to 50 and less than or equal to 500.

Figure 5A:
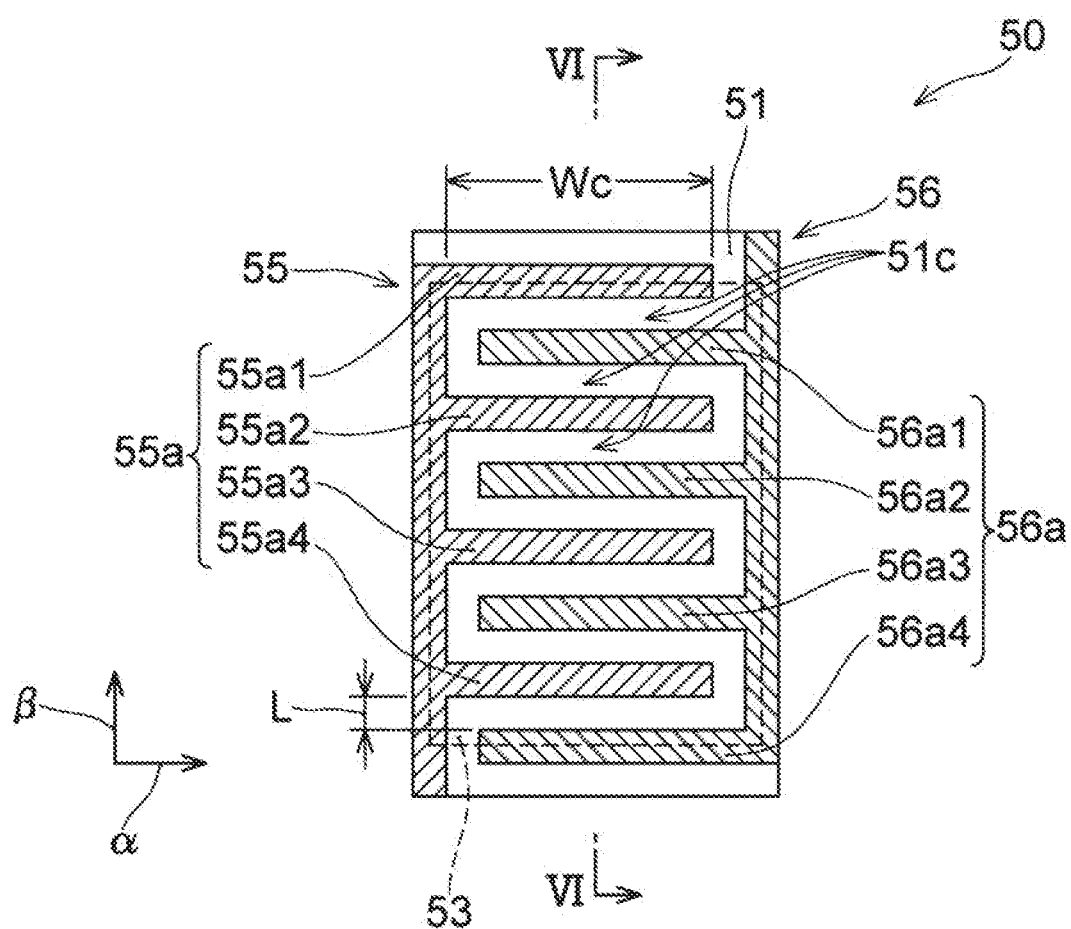
FIG. 5A shows a plan view of one example of a thin film transistor (TFT) that the organic-EL display apparatus according to one embodiment comprises.
Figure 5B:
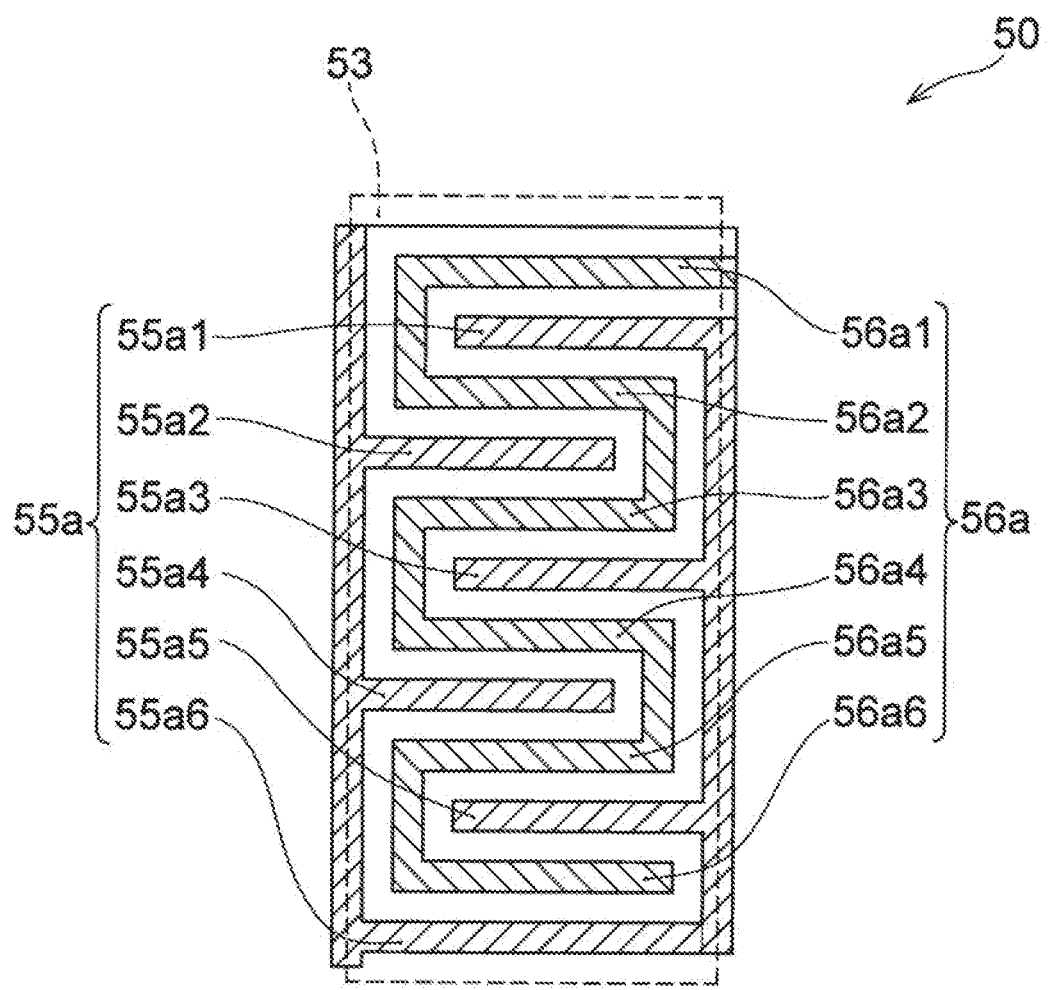
FIG. 5B shows a plan view of another example of the TFT that the organic-EL display apparatus according to one embodiment comprises.
Figure 6:
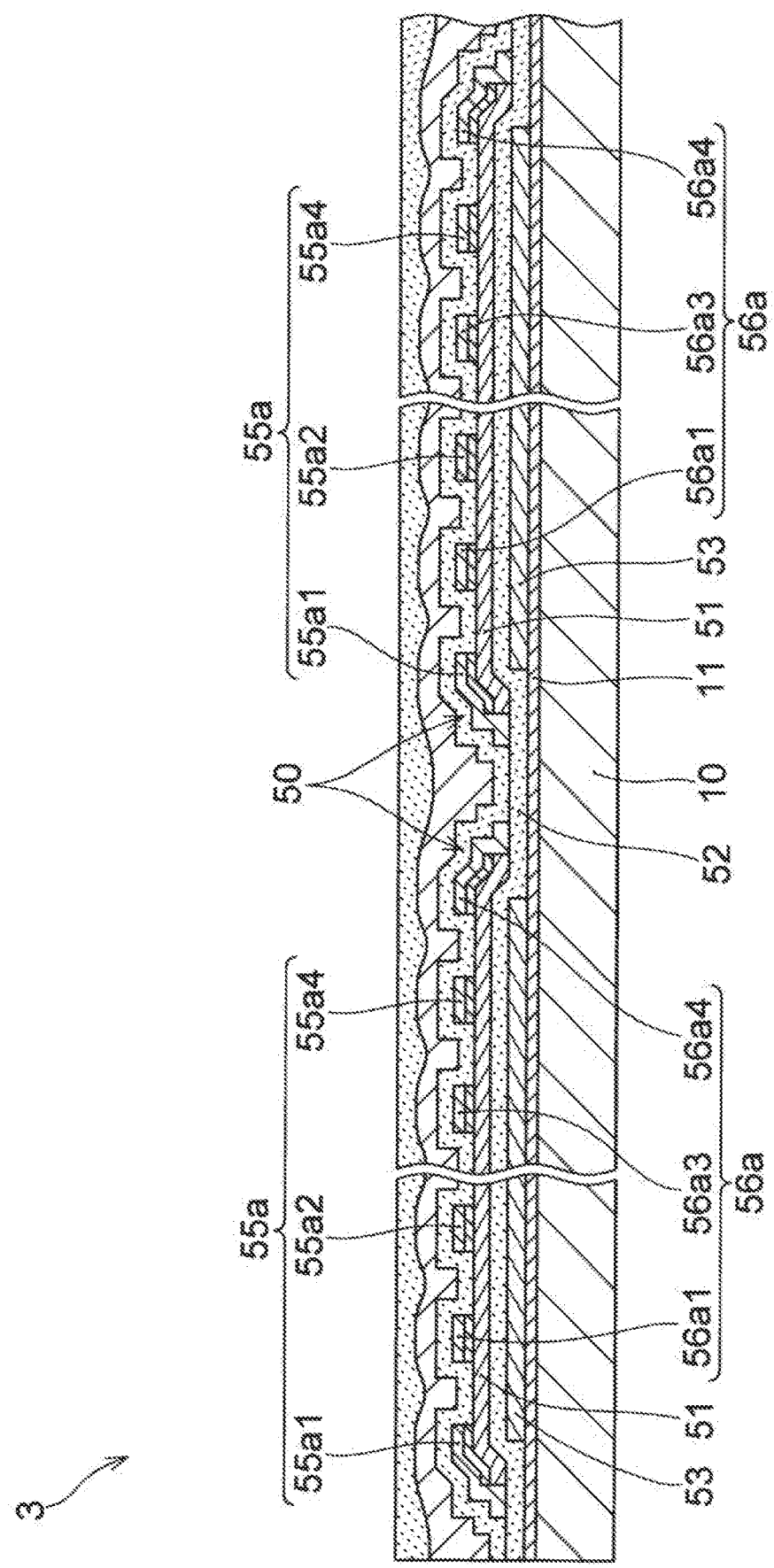
FIG. 6 shows a cross-sectional view of one example of the TFT that the organic-EL display apparatus according to one embodiment comprises.

FIGS. 5A and 5B each show other examples of the drive TFT 50 making up the signal output circuit 5, while FIG. 6 shows a cross-sectional view of the plurality of drive TFT 50 being lined up at the edge of the organic-EL display panel 3 with the cross section along the line VI-VI in FIG. 5A as an example. In FIGS. 5A and 5B, hatching is provided for the drain electrode 56 and the source electrode 55. For example, forming the drive TFT 50 as shown in FIGS. 5A and 5B makes it possible to provide a channel having a large W/L ratio in a region having a predetermined size in the organic-EL display panel 3.

The drain electrode 56 and the source electrode 55 are configured with a conductor layer comprising titanium or aluminum. Other than titanium and aluminum, pure metals such as molybdenum, magnesium, and tungsten, and various aluminum alloys (for example, aluminum-neodymium alloy, aluminum-zirconium alloy, and aluminum-tantalum alloy) and copper alloys (for example, copper-molybdenum alloy) are exemplified as a material for the conductor layer making up the drain electrode 56 and the source electrode 55. In the examples in FIGS. 5A and 6, parts of each of a first conductor layer 56a making up the drain electrode 56 and a second conductor layer 55a making up the source electrode 55 are alternately lined up along a predetermined direction. In the example in FIG. 5A, the parts of each conductor layer are alternately lined up along the upward/downward direction (p direction) in FIG. 5A. A region 51c to be a channel is a region being sandwiched between a part of the first conductor layer 56a and a part of the second conductor layer 55a in the semiconductor layer 51. Application of a predetermined voltage to the gate electrode 53 causes a channel to be formed in the region 51c and the drain electrode 56 and the source electrode 55 to electrically conduct with each other.

In this way, the part of the first conductor layer 56a and the part of the second conductor layer 55a are alternately lined up along the predetermined direction (β direction in FIG. 5A), therefore, it is possible to obtain the drain electrode 56 and the source electrode 55 each having a long portion at which these electrodes face each other in a region having a predetermined size. Therefore, a channel having a long channel width (W) can be formed. On the other hand, the channel length L is an interval between the first conductor layer 56a and the second conductor layer 55a, so that it does not increase in conjunction with the part of the first conductor layer 56a and the part of the second conductor layer 55a being alternately lined up. Therefore, a limited region can be effectively utilized to form a channel having a large ratio (W/L) of the channel width (W) and the channel length (L), or, in other words, a channel through which a large current is allowed to flow.

In the example in FIG. 5A, each of the first conductor layer 56a and the second conductor layer 55a is formed into a comb shape in planar view. Then, comb tooth portions (first portions 56a1 to 56a4 in the example in FIG. 5A) of the first conductor layer 56a and comb tooth portions (second portions 55a1 to 55a4 in the example in FIG. 5A) of the second conductor layer 55a are formed such that the comb tooth portions of the first conductor layer 56a engage with the comb tooth portions of the second conductor layer 55a. Unlike the example in FIG. 5A, a length We of a comb tooth portion of the first conductor layer 56a and a comb tooth portion of the second conductor layer 55a can be longer than the length of a coupling portion to couple the comb tooth portions together. In other words, in FIG. 5A, the shape of the entirety of the drain electrode 56 and the source electrode 55 can be a laterally long shape.

As shown in FIG. 6, the gate electrode 53 and the semiconductor layer 51 are formed so as to each overlap with facing portions (all of the facing portions in the example in FIG. 6) of the first portions 56a1 to 56a4 and the second portions 55a1 to 55a4. In the top gate-type TFT such as the example in FIG. 3 referred to previously, the gate electrode 53 is formed above the first conductor layer 56a and the second conductor layer 55a (on the gate insulating layer 52) and the semiconductor layer 51 is formed on the first conductor layer 56a and on the second conductor layer 55a, and on the base coat layer 11. Moreover, the gate electrode 53 is formed such that the gate electrode 53 overlaps with portions between the second conductor layer 55a and the first portions 56a1 to 56a4, at which the tips of the first portions 56a1 to 56a4 face the second conductor layer 55a in a direction (a direction in FIG. 5A) being orthogonal to the β direction, and such that the gate electrode 53 overlaps with portions between the first conductor layer 56a and the second portions 55a1 to 55a4, at which the tips of the second portions 55a1 to 55a4 face the first conductor layer 56a in the α direction. Therefore, the channel is formed in the entirety (entire length) of the region Sic between the first conductor layer 56a and the second conductor layer 55a so that this region 51c which is to be a channel has a zig-zag shape. Therefore, a channel having a large channel width (W), namely, a channel through which a large current is allowed to flow can be formed, effectively using a limited region as exactly shown in FIG. 5A.

In the example in FIG. 5B, the first conductor layer 56a is formed so as to have a zig-zag planar shape in which first portions 56a1 to 56a6 being a part of the first conductor layer 56a are coupled at an alternately different end portion. Then, the second conductor layer 55a is formed at the surroundings of the first conductor layer 56a and further each of second portions 55a1 to 55a6 being a part of the second conductor layer 55a is inserted into a concavity of the zig-zag planar shape that the first conductor layer 56a has. Moreover, in the example in FIG. 5B, the shape of the second conductor layer 55a and the shape of the first conductor layer 56a can be reversed. As exemplified in FIG. 5B, the first conductor layer 56a and the second conductor layer 55a do not necessarily have to be formed in a comb tooth shape as in the example in FIG. 5A.

Preferably, the drain electrode 56 and the source electrode 55 are formed, as in the example in FIG. 5A, in at least one of the plurality of drive TFTs 50 making up the signal output circuit 5. Preferably, the drive TFT 50 in which a high current rating is required as with the drive TFT 50 (the TFT 50a in the example in FIG. 4B) to be provided at the output (for example, $Q_n$ in the example in FIG. 4B) of the signal output circuit 5, for example, is formed as in the example in FIG. 5A. In the first and second pixel TFTs 20, 2a (see FIGS. 1 and 2) making up the pixel drive circuit 2, in the same manner as in the examples in FIGS. 5A and 5B, parts of each of a conductor layer making up the drain electrode 26 and a conductor layer making up the source electrode 25 can be alternately lined up along a predetermined direction. In this way, a region having a predetermined size can be effectively utilized to form the pixel drive circuit 2 having a high drive capability, so that it is possible to form the pixel drive circuit 2 having a high drive capability in one pixel.

Figure 7:
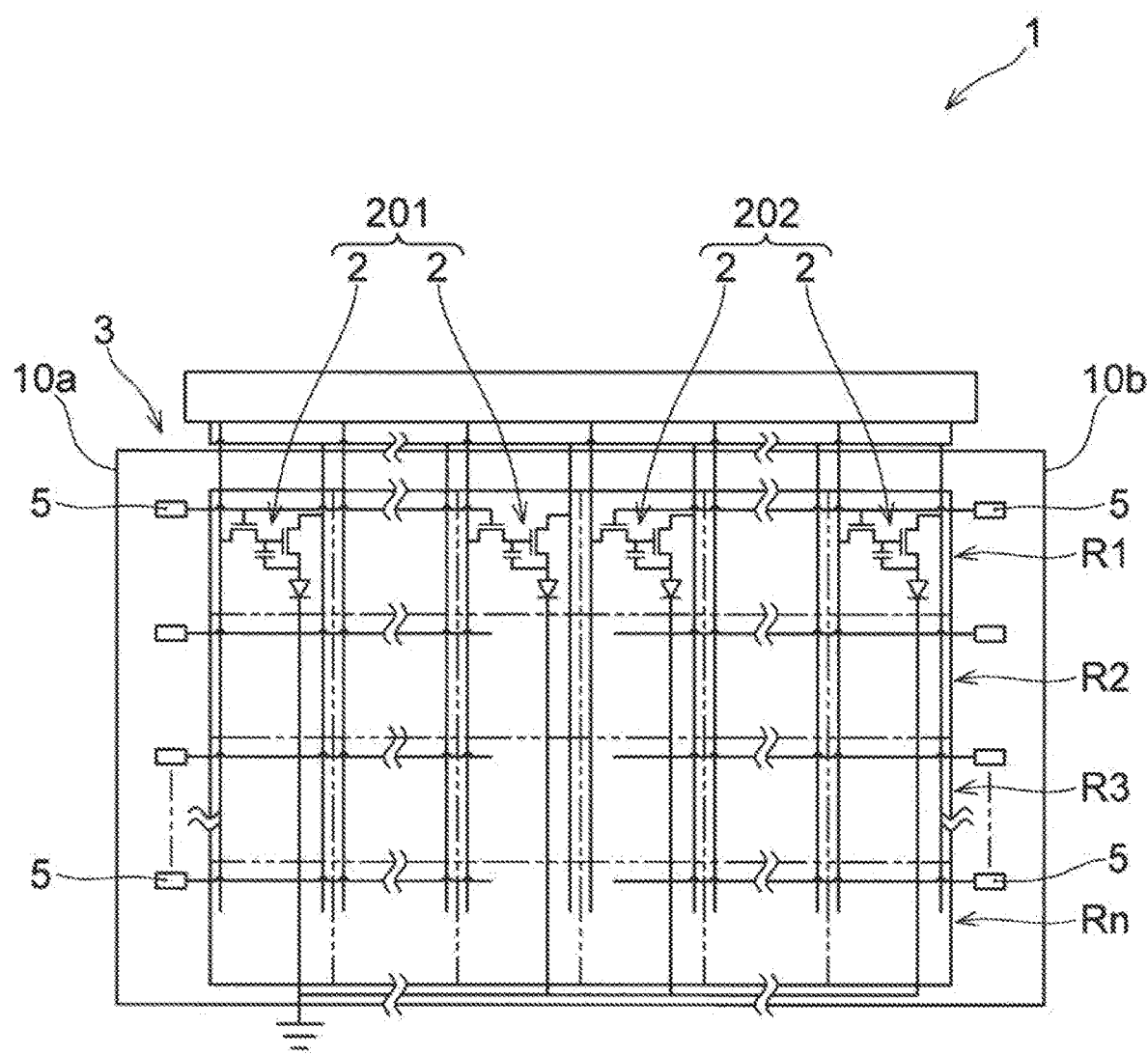
FIG. 7 schematically shows a view of another example of the configuration of the organic-EL display apparatus according to one embodiment.

FIG. 7 shows another example of the organic-EL display apparatus 1 according to one embodiment of the invention. In the example in FIG. 7, the substrate 10 (see FIG. 2) provided to the organic-EL display panel 3 has a substantially rectangular planar shape, and the signal output circuit 5 in one or a plurality is formed at each of edge parts of the substrate 10, the edge parts being along a first side 10a and a second side 10b, the first side 10a and the second side 10b opposing each other. FIG. 7 shows an example in which the plurality of signal output circuits 5 is provided along each of the first side 10a and the second side 10b. Then, a first group 201 of the plurality of pixel drive circuits 2 being lined up in one row (each of a row R1 to a row Rn) along a direction (a first direction X in the example in FIG. 7) being substantially orthogonal to the first side 10a and the second side 10b of the substrate 10 is connected to the signal output circuit 5 being formed at the edge along the first side 10a. Then, a second group 202 consisting of the pixel drive circuits 2 being other than those in the first group 201 in the row in which the first group 201 is lined up is connected to the signal output circuit 5 being formed at the edge part along the second side 10b. In the example in FIG. 7, at the center of each of the rows R1 to Rn, the plurality of pixel drive circuits 2 being lined up in each row is divided into the first group 201 and the second group 202, the first group 201 is configured with the pixel drive circuits 2 in the left half of FIG. 7, while the second group 202 is configured with the pixel drive circuit 2 in the right half of FIG. 7.

Therefore, a scanning line signal is supplied from the signal output circuit 5 being formed at the edge part along the first side 10a to the pixel drive circuit 2 included in the first group 201. Then, a scanning line signal is supplied from the signal output circuit 5 being formed at the edge part along the second side 10b to the pixel drive circuit 2 comprised in the second group 202. Such a configuration makes it possible to decrease the load of the individual signal output circuit 5. Moreover, the wiring length up to the pixel drive circuit 2 being most distant from the signal output circuit 5 can be decreased, making it possible to reduce the wiring resistance. Therefore, a large current can be supplied to the pixel drive circuit 2 and the pixel drive circuit 2 can be rapidly switched. When a signal output circuit being configured with TFTs in which LTPS is used for a semiconductor layer is provided as in the example in FIG. 7, variations in the characteristics as described previously can cause variations to occur in the operation of the pixel drive circuits of the first group and the operation of the pixel drive circuits of the second group. However, in the present embodiment, such a problem is unlikely to occur since the semiconductor layer 51 (see FIG. 2) of the drive TFT 50 making up the signal output circuit 5 is formed with amorphous silicon.

In the configuration exemplified in FIG. 7, the signal output circuit 5 can be formed at each of the edge parts along two sides being orthogonal to each of the first side 10a and second side 10b. Moreover, the first group of the plurality of pixel drive circuits 2 being lined up in one column along the second direction Y in FIG. 7 can be connected to the signal output circuit 5 being arranged at the edge part along one of two sides opposing each other, and the second group other than the first group can be connected to the signal output circuit 5 being arranged at the edge part along the other of the two sides opposing each other. Furthermore, the plurality of pixel drive circuits 2 being lined up in one row or column can be divided into the first group and the second group at an arbitrary position.

Again with reference to FIG. 2, constituting elements other than the signal output circuit 5 and the pixel drive circuit 2 in the organic-EL display apparatus 1 are described. A glass substrate or a polyimide film is mainly used for the substrate 10. The base coat layer 11 comprising a deposited layer of an $SiO_2$ layer and an $SiN_x$ layer is formed as a barrier layer on the surface of the substrate 10 on which the first pixel TFT 20 is formed. The pixel drive circuit 2 and the signal output circuit 5 described previously are formed on the base coat layer 11. The cathode wiring 27 is also formed on the base coat layer 11.

The planarizing layer 30 is formed so as to cover the pixel drive circuit 2. The planarizing layer 30 comprises a first inorganic insulating layer 31 being deposited on the pixel drive circuit 2, the organic insulating layer 32 being deposited on the first inorganic insulating layer 31, and a second inorganic insulating layer 33 being deposited on the organic insulating layer 32. In the example in FIG. 2, the planarizing layer 30 also covers the signal output circuit 5, so that the surface of the substrate 10 is highly planarized also at the edge part of the organic-EL display panel 3. Therefore, even in a case that the edge part of the organic-EL display panel 3 is brought into contact with a housing (not shown), the mechanical load can be dispersed without concentrating in a specific projection. A contact hole 30a to collectively penetrate the planarizing layer 30 is formed in the planarizing layer 30. The pixel drive circuit 2 and the organic light-emitting element 40 are connected via a metal being embedded in the contact hole 30a. The planarizing layer 30 can be configured with only the first inorganic insulating layer 33, or can be configured with the first inorganic layer 33 and the organic insulating layer 32, for example.

A surface of the planarizing layer 30 facing to an opposite orientation from the pixel drive circuit 2 (a surface of the second inorganic insulating layer 33 facing to an opposite orientation from the organic insulating layer 32) preferably has an arithmetic average roughness of less than or equal to 50 nm. For example, the surface of the planarizing layer 30 can be brought to less than or equal to 50 nm in arithmetic average roughness by being polished after depositing each insulating layer.

The inventors have also studied the cause of occurrence of display non-uniformity other than variations in the characteristics of the thin film transistor and have found that the surface of the organic light-emitting layer in the organic light-emitting element is not a completely planar surface, but comprises a minute unevenness, having a microscopically inclined portion. The surface of the organic light-emitting layer being inclined causes the normal direction of the surface of the organic light-emitting layer to incline relative to the normal direction of the display surface of the organic-EL display apparatus. In such a case, it becomes difficult to recognize a light emitted in the slanted direction from such an organic light-emitting layer from the front of the display surface. Therefore, deterioration in luminance, or variation in chromaticity determined by the intensity of light of each color of R, G, and B occurred.

Therefore, to preclude the cause of display non-uniformity being newly found, the surface of the planarizing layer 30 is preferably brought to less than or equal to 50 nm in arithmetic average roughness. Moreover, in the example in FIG. 2, the organic light-emitting layer 43 is formed while avoiding the position directly above the contact hole 30a. In this way, a display image having extremely small display non-uniformity can be obtained. On the other hand, the arithmetic average roughness being such as to be set as a target in the polishing process in the semiconductor process, for example, to be less than 20 nm, is not necessarily required with respect to the surface of the planarizing layer 30. It has been found that, when the surface of the planarizing layer 30 is less than or equal to 50 nm in arithmetic average roughness, such display non-uniformity as to be perceived by a human seldom occurs, so that, from the aspect of simplicity of realization, arithmetic average roughness of greater than or equal to 20 nm is preferable. Therefore, the surface of the planarizing layer 30 preferably has the arithmetic average roughness of greater than or equal to 20 nm and less than or equal to 50 nm. The surface of the organic insulating layer 32 can also be brought to the arithmetic average roughness of greater than or equal to 20 nm and less than or equal to 50 nm by polishing, as in the example in FIG. 3, so that improvement in planarity of the surface of the planarizing layer 30 can be facilitated as a result thereof. Even in that case, the suppression effect of the display non-uniformity described previously can be obtained.

In the present embodiment, preferably, not only the TFT 50 making up the signal output circuit 5, but also each TFT in the pixel drive circuit 2 is formed with amorphous silicon as described previously. In that case, to form a channel having a large W/L ratio described previously, preferably, a region right below a light-emitting region (in other words, the organic light-emitting layer 43) of each pixel is also utilized as a channel. In that case, from the aspect of eliminating the effect on the display quality due to unevenness of the surface of the pixel drive circuit 2, it is meaningful to provide the planarizing layer 30 between the pixel drive circuit 2 and the organic light-emitting element 40, the planarizing layer 30 having, on the surface, a high planarity of approximately less than or equal to 50 nm in arithmetic surface roughness.

The first inorganic insulating layer 31 is an $SiN_x$ layer having the thickness of approximately 200 nm, for example. Moreover, the organic insulating layer 32 has the thickness of approximately greater than or equal to 1 μm and less than or equal to 2 μm, for example, and the organic insulating layer 32 significantly decreases unevenness of the surface of the substrate 10 due to forming of the pixel drive circuit 2. The organic insulating layer 32 is formed using polyimide resin or acrylic resin, for example. While the organic insulating layer 32 can be formed using a photosensitive resin, it is preferable to use a material not comprising a photopolymerization initiator therein for the organic insulating layer 32 since the photopolymerization initiator weakens the effect of an additive agent (leveling improving agent) to improve the planarity of the surface of the organic insulating layer 32. As a material being preferable for the organic insulating layer 32, acrylic resin or polyimide resin not comprising the photopolymerization initiator can be exemplified.

While the second inorganic insulating layer 33 is formed with $SiN_x$ or $SiO_2$, for example, $SiN_x$ is preferable from the aspect of moisture barrier property. In other words, barrier performance with respect to moisture in the planarizing layer 30 is enhanced by the second insulating layer 33. Moreover, the second inorganic insulating layer 33 can have barrier action of moisture not only at the time of use of the organic-EL display apparatus 1, but also at the time of manufacturing thereof. For example, penetration of a cleaning agent used in the manufacturing process into the organic insulating layer 32 is prevented and, in turn, deterioration of the first pixel TFT 20 due to the cleaning agent being left is prevented.

The second inorganic insulating layer 33 is formed to the thickness of approximately greater than or equal to 100 nm and less than or equal to 600 nm, for example. However, the thickness of the second inorganic insulating layer 33 varies based on unevenness of the surface of the organic insulating layer 32. The second inorganic insulating layer 33 is formed so as to have a thickness of greater than or equal to three times a maximum height difference DT of the unevenness of the surface of the organic insulating layer 32, for example, such that the unevenness of the surface of the organic insulating layer 32 can be sufficiently embedded in the second inorganic insulating layer 33. Then, it is preferable that the surface of the second inorganic insulating layer 33 be polished, as needed, for the length (thickness) of greater than or equal to the maximum height difference DT and less than two times the maximum height difference DT. In this way, without exposing the organic insulating layer 32, it is possible to trim the protrusion of the surface of the inorganic insulating layer 33 and the surface of the planarizing layer 30 can be almost certainly brought to less than or equal to 50 nm in arithmetic average roughness.

The first electrode 41 of the organic light-emitting element 40 is integrally formed with the metal being embedded in the contact hole 30a and has the deposition structure comprising an ITO layer, a layer of a metal such as Ag or APC, and ITO layer, for example. The first electrode 41 preferably has a work function of approximately 5 eV, so that, in a case of the top emission-type, ITO and Ag or APC as described previously are used. In a case of the bottom emission-type, only the ITO layer having the thickness of approximately 300 nm to 1 μm, for example, is formed. A contact hole 30b to form the cathode contact 28 is also formed in the planarizing layer 30, and the contact hole 30b also collectively penetrates individual insulating layers making up the planarizing layer 30.

In a portion directly above the contact hole 30a of the surface of the first electrode 41 can be produced a hollow as shown in FIG. 2 in a case that the contact hole 30a is not completely filled with ITO. However, in the example in FIG. 2, the first electrode 41 has a region not overlapping in planar view with the contact hole 30a at a size being sufficient to form the organic light-emitting layer 43, and the organic light-emitting layer 43 is formed at the region not overlapping with the contact hole 30a. Therefore, non-uniformity of thickness of the organic light-emitting layer 43 and the hollow at the surface thereof are unlikely to be produced, and the display non-uniformity caused by the contact hole 30a is unlikely to be produced.

The insulating bank 42 to insulate the first electrode 41 from the second electrode 44 as well as to demarcate each pixel is formed at the peripheral edge of the first electrode 41. In the example in FIG. 2, the hollow of the surface of the first electrode 41 is covered with the insulating bank 42. Then, the organic light-emitting layer 43 is deposited on the first electrode 41 being surrounded by the insulating bank 42. The organic light-emitting layer 43 to be a light-emitting region of the organic light-emitting element 40 is preferably formed at a region not overlapping in planar view with the contact hole 30a as in the example in FIG. 2. In that case, as described previously, display non-uniformity caused by the contact hole 30a is unlikely to be produced. While the organic light-emitting layer 43 is shown as one layer in FIG. 1, it can be configured with a plurality of organic layers by depositing various materials.

For example, a positive hole injection layer is provided as a layer to make a contact with the first electrode 41, for example. A positive hole transport layer is formed on the positive hole injection layer with an amine-based material, for example. Moreover, a light-emitting layer to be selected in accordance with the light-emitting wavelength is formed thereon. With respect to red or green, for example, a red or green organic fluorescent material is doped to $Alq_3$. Furthermore, as a blue color-based material, a DSA-based organic material is used. Moreover, an electron transport layer can be formed on the light-emitting layer with $Alq_3$. The organic light-emitting layer 43 is formed by these individual layers being deposited to approximately several ten nm, respectively. An electron injection layer can be provided with LiF or Liq between the organic light-emitting layer 43 and the second electrode 44.

The second electrode 44 is formed on the organic light-emitting layer 43. In the example in FIG. 2, the second electrode 44 is continuously formed to be common across all the pixels, and is connected to the cathode wiring 27 via the cathode contact 28 being formed in the planarizing layer 30. The second electrode 44 is formed with a light-transmitting material, for example, a thin-film Mg—Ag layer. An alkaline metal or an alkaline earth metal can be used for the second electrode 44.

An encapsulating layer (TFE) 46 to prevent moisture from reaching to the second electrode 44 is formed on the second electrode 44. The encapsulating layer 46 comprises an inorganic insulating layer such as $SiN_x$ or $SiO_2$, for example, and is formed by forming a single-deposited film, or two or more layers of deposited film. For example, two layers of deposited film in which the thickness of each layer is approximately between 0.1 μm and 0.5 μm are formed as the encapsulation layer 46. The encapsulating layer 46 is formed so as to completely coat the organic light-emitting layer 43 and the second electrode 44. The encapsulating layer 46 can comprise an organic insulating layer between two inorganic insulating layers.

[Manufacturing Method for Organic-EL Display Apparatus]

Herein below, with the organic-EL display apparatus 1 shown in FIG. 2 as an example, a manufacturing method for an organic-EL display apparatus according to one embodiment is described with reference to flowcharts in FIGS. 8A and 8B and cross-sectional views shown in FIGS. 9A to 9G while also referring to FIG. 5A as needed.

Figure 8A:
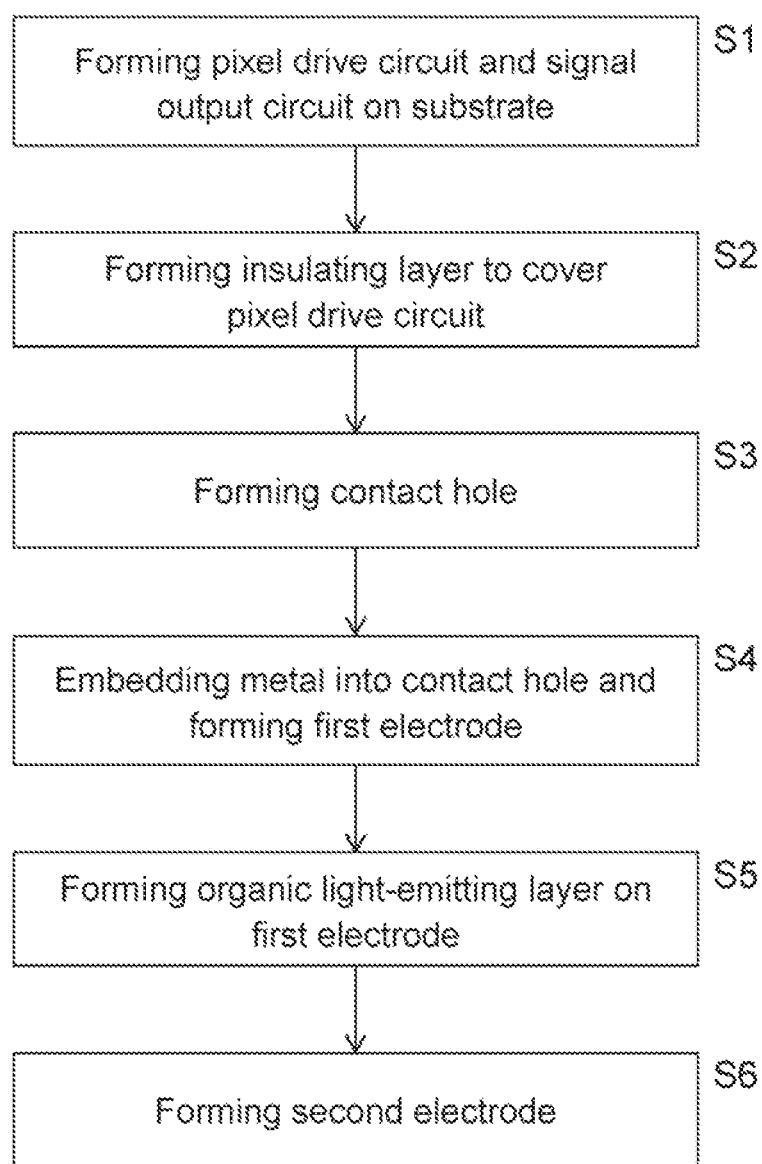
FIG. 8A shows a flowchart of a manufacturing method for the organic-EL display apparatus according to one embodiment of the present invention.
Figure 9A:
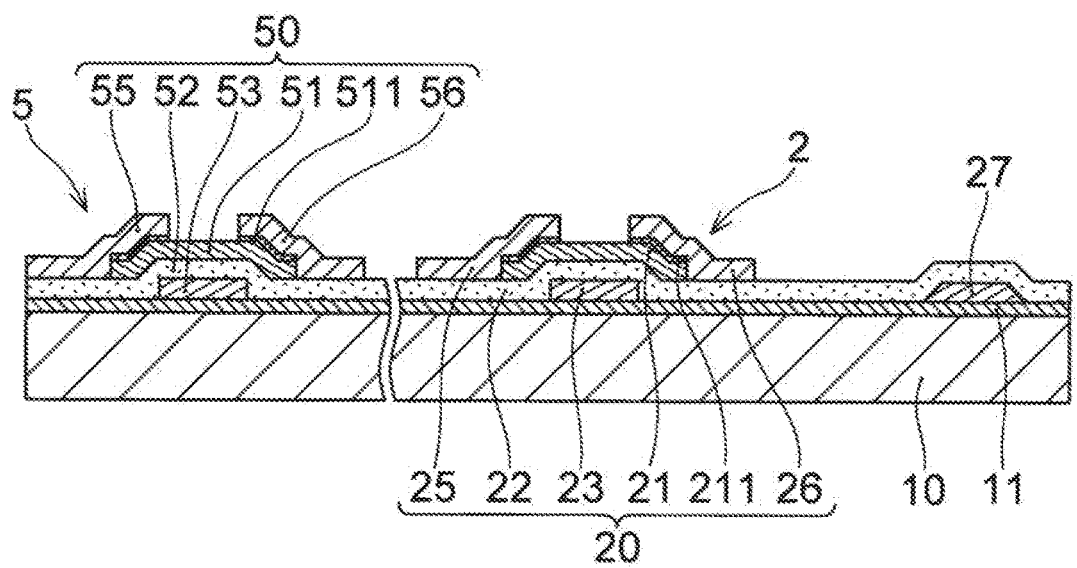
FIG. 9A shows a cross-sectional view showing a manufacturing method for an organic-EL display apparatus according to one embodiment of the present invention.

As shown in FIG. 9A, by forming a plurality of thin film transistors (first pixel TFT 20, for example) and a wiring (not shown) on a substrate 10, a plurality of pixel drive circuits 2 to drive the respective plurality of pixels 3a (see FIG. 2) to be arrayed in a matrix in an organic-EL display panel 3 (see FIG. 2) is formed (S1 in FIG. 8A). While not shown in FIG. 9A, along with the first pixel TFT 20, other thin film transistors making up the pixel drive circuit 2 are also formed. Moreover, by forming a plurality of thin film transistors (drive TFTs 50) at the edge part of the substrate 10, along with forming the pixel drive circuit 2, a signal output circuit 5 to supply a signal substantially simultaneously to each of the plurality of pixel drive circuits 2 being lined up is formed. The first pixel TFT 20 making up the pixel drive circuit 2 and the drive TFT 50 making up the signal output circuit 5 are formed by forming gate electrodes 23, 53, gate insulating layers 22, 52, drain electrodes 26, 56 and source electrodes 25, 55, and semiconductor layers 21, 51 comprising a region to be a channel between the drain electrode and the source electrode. Preferably, the drive TFT 50, and the first pixel TFT 20 making up the pixel drive circuit 2 are substantially simultaneously formed in parallel using the same process. Therefore, the backplane of an organic-EL display panel can be formed efficiently. Below, the details will be described.

In a case that the organic-EL display apparatus 1 shown in FIG. 2 is manufactured, a base coat layer 11 is formed on the surface of the substrate 10 using plasma CVD, for example. While the base coat layer 11 is shown with the single layer structure in FIG. 9A, it can be formed, for example, by depositing an $SiO_2$ layer being approximately 500 nm in thickness, an $SiN_x$ layer thereon, the $SiN_x$ layer being approximately 50 nm in thickness, and an $SiO_2$ layer further thereon, the $SiO_2$ layer being approximately 250 nm in thickness.

Figure 8B:
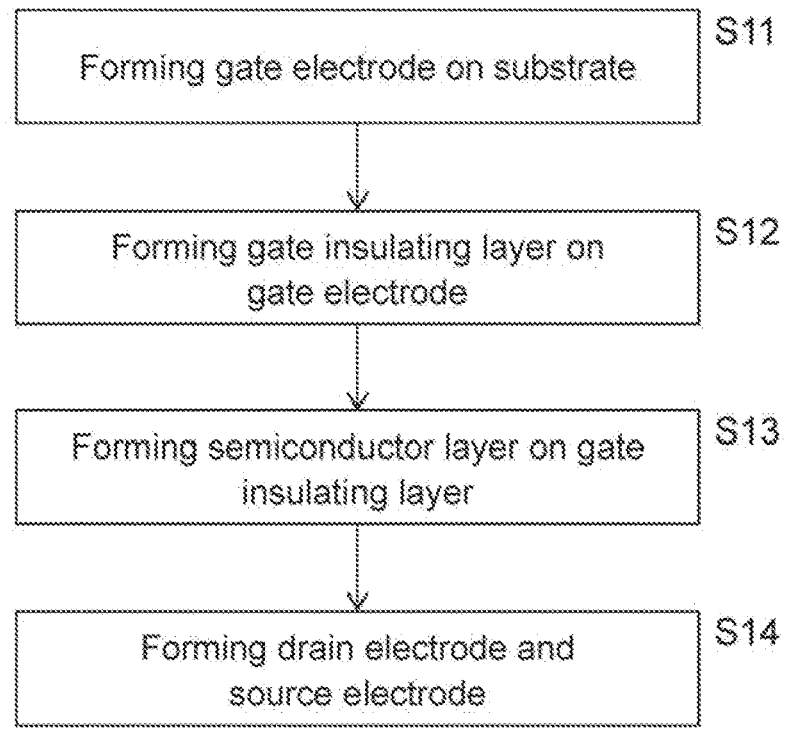
FIG. 8B shows a flowchart on a process for forming the TFT in FIG. 8A.

Thereafter, the gate electrodes 23, 53 are formed by forming, using sputtering, and patterning a layer of metal such as Mo (S11 in FIG. 8B). For example, as shown in FIG. 5A previously referred to, the gate electrode 53 extending in a predetermined direction (β direction in the example in FIG. 5A) in which a part of the first conductor layer 56a and a part of the second conductor layer 55a are alternately lined up can be formed. Preferably, along with the gate electrodes 23, 53, cathode wirings 27 and other individual wirings (not shown) in the pixel drive circuit 2 and the signal output circuit 5 are also formed.

The gate insulating layers 22, 52 are formed on the gate electrodes 23, 53 (S12 in FIG. 8B). The gate insulating layers 22, 52 are formed by forming an $SiO_2$ layer or an $SiN_x$ layer being approximately 50 nm in thickness, using plasma CVD, for example. Moreover, the semiconductor layers 21, 51 are formed on the gate insulating layers 22, 52 so as to cover the gate electrodes 23, 53, using plasma CVD, for example (S13 in FIG. 8B). A dehydrogenation process is carried out for the semiconductor layers 21, 51 by annealing for approximately 45 minutes at the temperature of approximately 350° C., for example. The semiconductor layers 21, 51 are patterned to a desired shape using dry etching, for example. In a case that the gate electrode 53, as described previously, extends in a predetermined direction in which a part of the first conductor layer 56a and a part of the second conductor layer 55a are alternately lined up as in the example in FIG. 5A, the semiconductor layer 51 extending along the predetermined direction in order to cover the entire gate electrode 53 can be formed.

In the present embodiment, at least the semiconductor layer 51 of the drive TFT 50 making up the signal output circuit 5 is formed with amorphous silicon. In other words, poly-crystallization by carrying out the previously-described ELA process is not carried out. Therefore, the signal output circuit 5 having stable characteristics can be formed in less steps relative to a case in which LTPS is used in forming the drive TFT 50 and, therefore, inexpensively without using expensive facilities. Moreover, each thin film transistor (the first pixel TFT 20) making up the pixel drive circuit 2 is also formed with amorphous silicon. In that case, the entire backplane of the organic-EL display panel can be formed inexpensively in a simple process.

Thereafter, second semiconductor layers 211, 511 having a high impurities concentration are preferably formed on the semiconductor layers 21, 51. In this way, the contact resistance between the semiconductor layers 21, 51, and the drain electrodes 26, 56 and the source electrodes 25, 55 can be decreased. The individual second semiconductor layers 211, 511 can be formed by doping impurities to a predetermined region of the individual semiconductor layers, for example. As the impurities, phosphorus or arsenic, or boron or aluminum can be exemplified in accordance with the electrical conductance-type of each TFT to be formed.

The drain electrodes 26, 56 and the source electrodes 25, 55 are formed on the semiconductor layers 21, 51 (or the second semiconductor layers 211, 511) and the gate insulating layers 22, 52 (S14 in FIG. 8B). For example, a titanium layer or an aluminum layer or a deposited layer comprising these layers having a thickness of several hundred nm can be formed using sputtering, for example, and the formed layer is separated into the drain electrode 26, the drain electrode 56, the source electrode 25, and the source electrode 55 by dry etching, for example.

In forming the drive TFT 50 making up the signal output circuit 5, the gate electrode 53, the drain electrode 56, and the source electrode 55 are preferably formed so that the ratio (W/L) of the channel width (W) to the channel length (L) of the channel of the drive TFT 50 is greater than or equal to 50 and less than or equal to 500. In this way, the drive TFT 50 having the drive capability being not substantially inferior relative to a case in which the semiconductor layer 51 is formed with LTPS can also be formed while forming the semiconductor layer 51 with amorphous silicon.

For example, in forming the drive TFT 50, each of the source electrode 55 and the drain electrode 56 can be formed to have a comb shape as a planar shape as in the example in FIG. 5A. In other words, the source electrode 55 and the drain electrode 56 can be formed so as to comprise either or both of a recess and a projection in a planar shape. In that case, the drain electrode 56 and the source electrode 55 are formed such that a recess of the drain electrode 56 and a projection of the source electrode 55 face each other or a projection of the drain electrode 56 and a recess of the source electrode 55 face each other, for example. In this way, the drive TFT 50 comprising a channel having a high W/L ratio can be efficiently formed in a region of the organic-EL display panel 3 which is a region other than the display region 3b (see FIG. 1), for example, a limited region at the edge part of the substrate 10. Even the first pixel TFT 20 making up the pixel drive circuit 2 can be formed to comprise the drain electrode 26 and the source electrode 25 having a planar shape of a comb shape.

For example, the drive TFT 50, and the first and second pixel TFTs 20, 2a are formed by undergoing the process shown in FIG. 8B in this way and, as a result, the signal output circuit 5 and the pixel drive circuit 2 are formed. The signal output circuit 5 being formed can be a scan driver (a gate driver or a scanning line driver) to supply a scanning line signal of an organic-EL display panel to the pixel drive circuit 2, or an emission driver (a source driver or a data line driver) to supply a data signal of a display image to the pixel drive circuit 2.

In a case that the first pixel TFT 20 being exemplified in FIG. 3 and the top gate-type drive TFT 50 (not shown) are formed, while these top gate-type TFTs have substantially reverse orders with respect to the formation of individual constituting elements, they can be formed in a method being substantially the same as that for forming individual bottom gate-type TFTs shown in FIG. 2. Therefore, explanations therefor will be omitted.

Figure 9B:
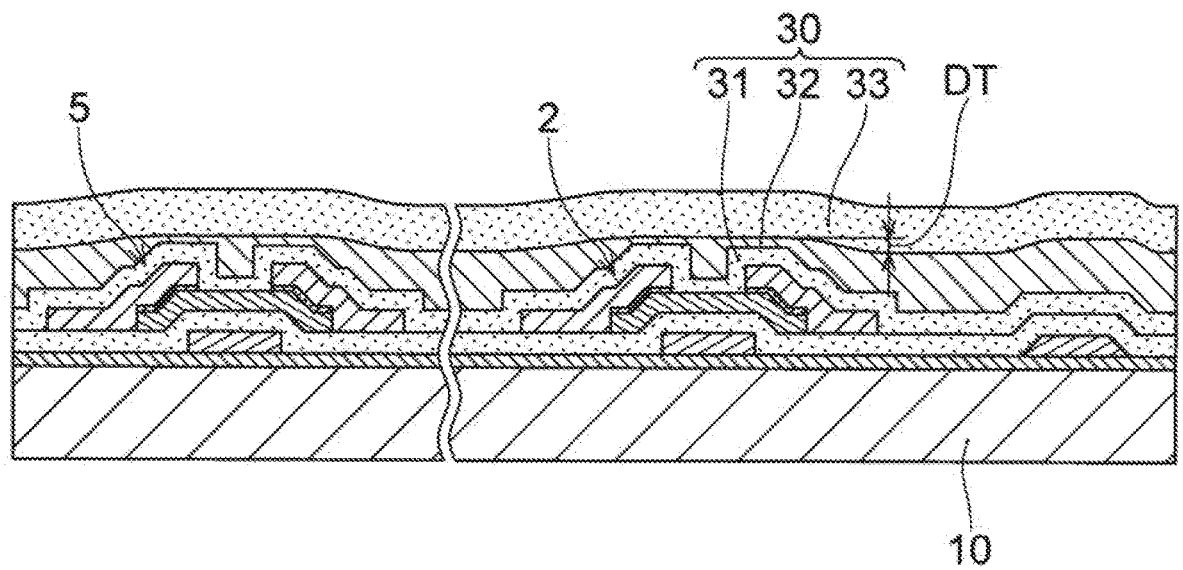
FIG. 9B shows a cross-sectional view showing the manufacturing method for the organic-EL display apparatus according to one embodiment of the present invention.

After the signal output circuit 5 and the pixel drive circuit 2 are formed, an insulating layer to cover at least the surface of the pixel drive circuit 2 is formed as shown in FIG. 9B (S2 in FIG. 8A). In a case that the organic-EL display apparatus 1 in the example in FIG. 2 is formed, as shown in FIG. 9B, a first inorganic insulating layer 31, an organic insulating layer 32, and a second inorganic insulating layer 33 are formed so as to cover at least the surface of the pixel drive circuit 2. By forming these insulating layers 31 to 33, a planarizing layer 30 to planarize the surface of the substrate 10 is formed. Preferably, the planarizing layer 30 is formed such that planarizing layer 30 also covers the signal output circuit 5. In this way, even at the edge part of the organic-EL display panel, the surface of the organic-EL display panel is planarized, making it easy to handle the organic-EL display panel or decreasing stress due to friction in a case of combining with a housing (not shown), for example.

The first inorganic insulating layer 31 is formed by forming a layer of $SiN_x$ or $SiO_2$ being approximately 200 nm in thickness using plasma CVD, for example. The organic insulating layer 32 is formed by applying a liquid resin or low-viscosity paste-like resin. As applying methods, slit coating, spin coating, and slit and spin coating combining both thereof are exemplified. The organic insulating material 32 is formed so as to have a thickness of approximately greater than or equal to 1 μm and less than or equal to 2 μm. As a material for the organic insulating layer 32, polyimide resin or acrylic resin can be used, for example.

In the same manner as the first inorganic insulating layer 31, the second inorganic insulating layer 33 is formed by forming a layer consisting of $SiN_x$ or $SiO_2$ using plasma CVD, for example. Forming the second inorganic insulating layer 33 makes it possible to prevent penetration, into the organic insulating layer 32, of various solvents such as a cleaning agent that can be used in a post-process, and the possibly-resulting deterioration of the first pixel TFT 20 (see FIG. 9A).

The second inorganic insulating layer 33 is preferably formed so as to have a thickness selected based on a maximum height difference DT of unevenness of the surface of the organic insulating layer 32. For example, the second inorganic insulating layer 33 is formed so as to have a thickness of greater than or equal to two times the maximum height difference DT and less than or equal to three times the maximum height difference DT of the surface of the organic insulating layer 32. In this way, a recess of the organic insulating layer 32 can surely be filled. In addition, unevenness that can appear on the surface of the second inorganic insulating layer 33 after forming of the second inorganic insulating layer 33 can surely be leveled in a polishing process to be carried out as needed as described below and, even more, exposure of the organic insulating layer 32 by the polishing can be almost surely prevented.

Figure 9C:
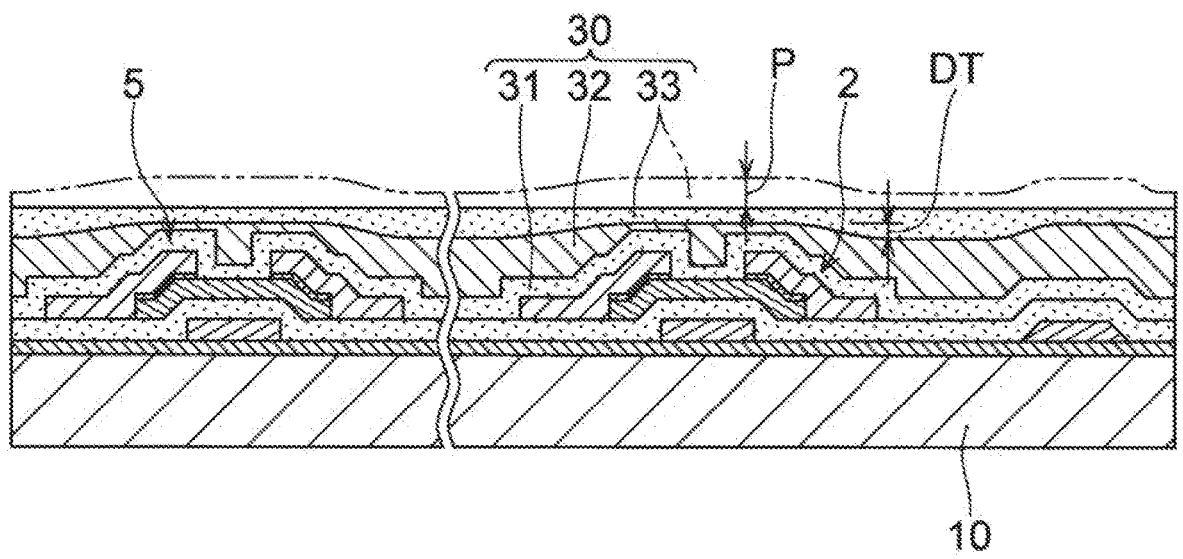
FIG. 9C shows a cross-sectional view showing the manufacturing method for the organic-EL display apparatus according to one embodiment of the present invention.

Next, preferably, as shown in FIG. 9C, the surface of the second inorganic insulating layer 33 is polished. As described previously, it has been found by the present inventors that, in a case that the surface of a planarizing layer to be the base layer for an organic light-emitting element is not sufficiently planar, display non-uniformity can occur in the organic-EL display apparatus. Therefore, the surface of the second inorganic insulating layer 33 being the surface of the planarizing layer 30 is preferably polished before forming the organic light-emitting element 43 described below. The surface of the second inorganic insulating layer 33 is preferably polished so as to have an arithmetic average roughness of less than or equal to 50 nm. Polishing the surface to the surface roughness of such a degree and, moreover, forming the organic light-emitting layer 43 while avoiding the position directly above the contact hole 30a (see FIG. 2) as described later make it possible to cause display non-uniformity such as to be detected by a human being to almost not occur as described previously. Then, to avoid a complicated and time-consuming polishing process, the surface of the second insulating layer 33 is preferably polished so as to have an arithmetic average roughness of greater than or equal to 20 nm and less than or equal to 50 nm.

The second inorganic insulating layer 33, in polishing the surface thereof, is polished such that a polishing amount P (an amount of decrease in the thickness of the second inorganic insulating layer 33 due to polishing) at least partially reaches an amount greater than or equal to one times the maximum height difference DT and less than two times the maximum height difference DT of the unevenness of the surface of the organic insulating layer 32, for example. In this way, in a case that the second inorganic insulating layer 33 is formed so as to have the thickness of greater than or equal to twice the maximum height difference DT of the unevenness of the organic insulating layer 32 as described previously, unevenness that can appear on the surface of the second inorganic insulating layer 33 after forming thereof based on the unevenness of the organic insulating layer 32 can surely be leveled. Even more, it is possible to almost prevent certainly the exposure of the organic insulating layer 32 due to polishing.

A method for polishing the second inorganic insulating layer 33 is construed to be not particularly limited. To achieve the arithmetic average roughness of less than or equal to 50 nm, the second inorganic insulating layer 33 is preferably polished using CMP polishing, in which a neutral slurry containing cerium, colloidal silica, or fumed silica is used as a polishing agent. The CMP polishing makes it possible to rapidly obtain a smooth polishing surface. Moreover, for polishing of the second inorganic insulating layer 33, neutral aqueous alcohol or potassium hydroxide aqueous solution is used with the previously-described polishing agent. A neutral alcohol is preferable in that, in a case the substrate 10 is formed with polyimide resin, corrosion thereof can be avoided.

The planarizing layer 30 does not necessarily need to have the three-layer structure as shown in FIG. 9C, so that it can be formed with only the first inorganic insulating layer 31 and the organic insulating layer 32. In that case, the surface of the organic insulating layer 32 can be polished, and the surface of the organic insulating layer 32 can be polished so as to have an arithmetic average roughness of greater than or equal to 20 nm and less than or equal to 50 nm, for example.

Figure 9D:
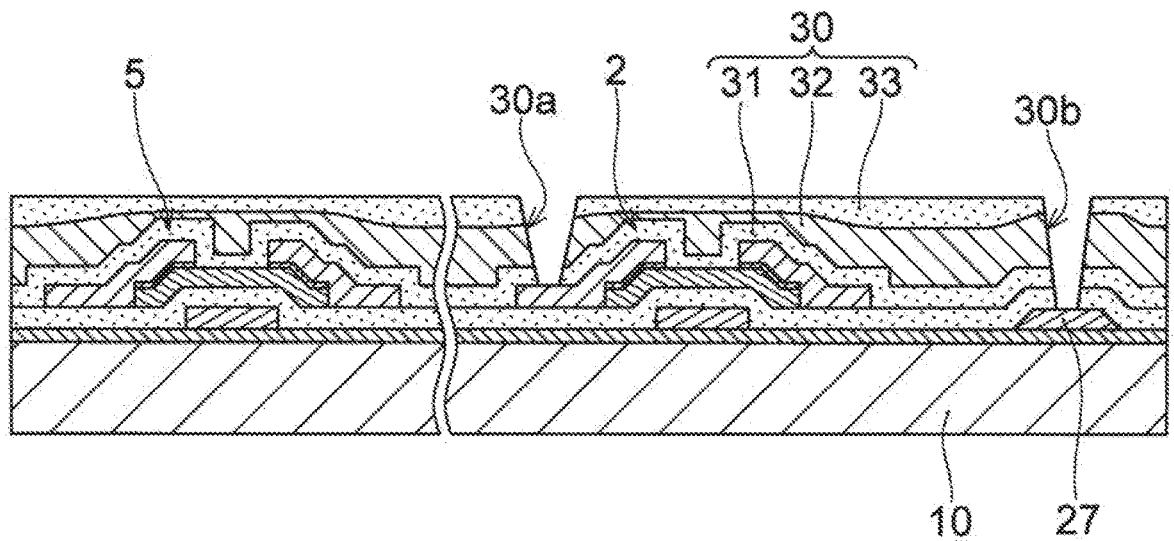
FIG. 9D shows a cross-sectional view showing the manufacturing method for the organic-EL display apparatus according to one embodiment of the present invention.

After the planarizing layer 30 is formed, the organic light-emitting element 40 (see FIG. 2) is formed. The organic light-emitting element 40 is formed on the surface of an insulating layer making up the planarizing layer 30 such that the organic light-emitting element 40 is connected to the pixel drive circuit 2 via a metal to penetrate the insulating layer. In a case that the organic-EL display apparatus 1 in FIG. 2 is manufactured, the organic light-emitting element 40 is formed on the surface of the second inorganic insulating layer 33. As described previously, in a case that the second inorganic insulating layer 33 is not formed, the organic light-emitting element 40 can be formed on the surface of the organic insulating layer 32. First, as shown in FIG. 9D, a contact hole 30a is formed in the planarizing layer 30 so as to reach the pixel drive circuit 2 (S3 in FIG. 8A). Preferably, the contact hole 30a to collectively penetrate the three insulating layers making up the planarizing layer 30 is formed. The contact hole 30a is preferably formed at a region not overlapping, in the thickness direction of the substrate 10, with a region at which an organic light-emitting layer 43 (see FIG. 9F) is to be formed in a below-described formation step of the organic light-emitting layer 43. In this way, as described previously, an occurrence of display non-uniformity is prevented. Forming of the contact hole 30a is carried out by dry etching, for example. At the time of forming the contact hole 30a, a contact hole 30b for the cathode contact 28 (see FIG. 2) is formed in a portion above the cathode wiring 27 in the planarizing layer 30.

Figure 9E:
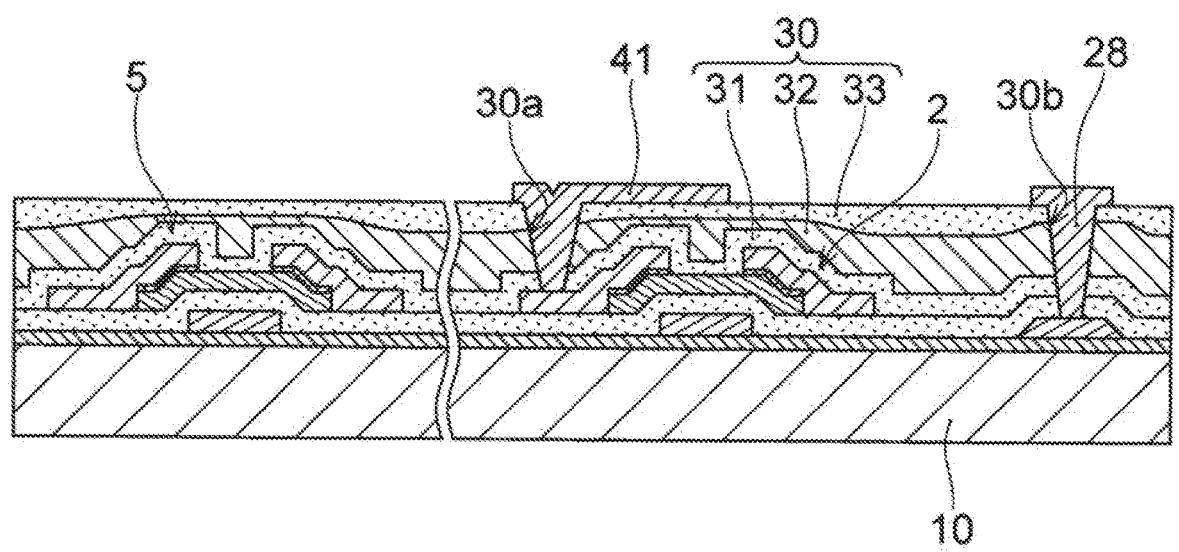
FIG. 9E shows a cross-sectional view showing the manufacturing method for the organic-EL display apparatus according to one embodiment of the present invention.

As shown in FIG. 9E, a metal is embedded at the interior of the contact hole 30a and a first electrode 41 of the organic light-emitting element 40 (see FIG. 2) is formed in a predetermined region (S4 in FIG. 8A). Specifically, using sputtering, for example, an underlayer in which an ITO layer of approximately 10 nm in thickness and an Ag layer or an APC layer of approximately 100 nm in thickness are deposited, and an overlayer mainly comprising an ITO layer of approximately 10 nm in thickness are formed. As a result, the metal is embedded at the interior of the contact hole 30a and a deposited layer consisting of an ITO layer, an Ag layer or an APC layer, and an ITO layer is formed on the planarizing layer 30. The deposited layer is patterned to form the first electrode 41. Preferably, as shown in FIG. 9E, this deposited layer is patterned such that the first electrode 41 has a region having a sufficient size with respect to forming of the organic light-emitting layer 43 (see FIG. 9F) and not overlapping with the contact hole 30a in planar view. At the time of embedding the metal into the contact hole 30a, the contact hole 30b is filled with at least the ITO layer, and the Ag layer or the APC layer, so that the cathode contact 28 is formed.

Figure 9F:
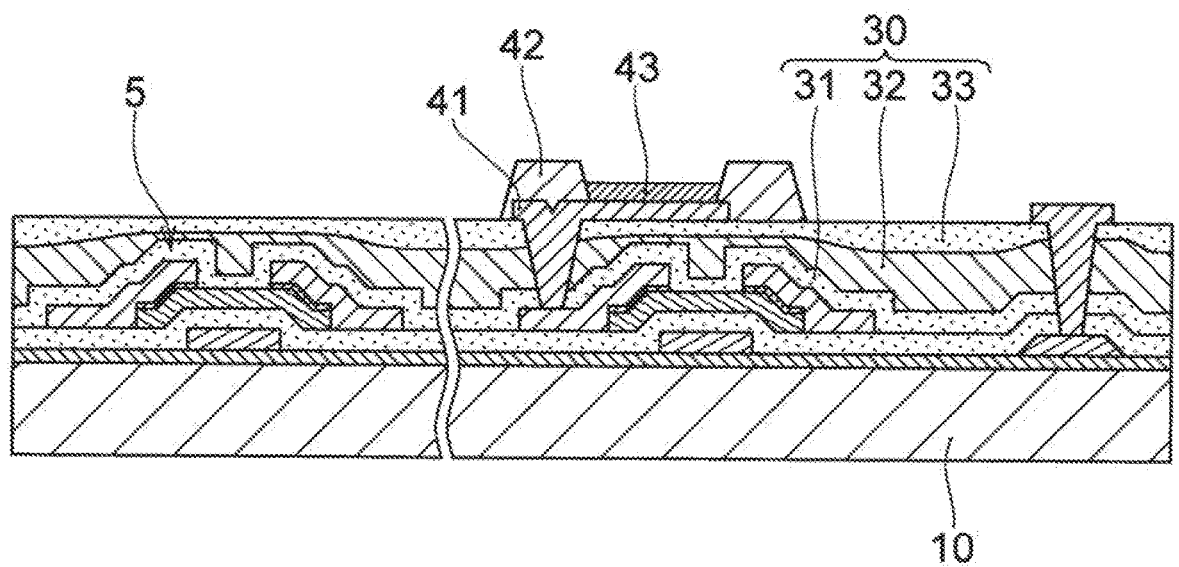
FIG. 9F shows a cross-sectional view showing the manufacturing method for the organic-EL display apparatus according to one embodiment of the present invention.

As shown in FIG. 9F, the organic light-emitting layer 43 is formed on the first electrode 41 (S5 in FIG. 8A). Specifically, an insulating bank 42 is formed at the peripheral edge of the first electrode 41. The insulating bank 42 can be an inorganic insulating layer such as $SiO_2$ or an organic insulating layer such as polyimide or acrylic resin. For example, such an insulating layer is formed on the entire surface of the planarizing layer 30 and the first electrode 41 and a predetermined region of the first electrode 41 is exposed by patterning the formed insulation layer. Preferably, a region of the first electrode 41 is exposed, which does not overlap with the contact hole 30a in the thickness direction of the substrate 10. The insulating bank 42 is formed so as to have a height of approximately 1 μm. As described previously, various organic materials are deposited in forming the organic light-emitting layer 43. Deposition of the organic material is carried out by vacuum vapor deposition, for example, in which case the organic material is vapor-deposited via a vapor-deposition mask having an aperture corresponding to a desired pixel such as R, G, or B. The organic light-emitting layer 43 can be formed, not by vapor deposition, but by printing using an inkjet method.

Figure 9G:
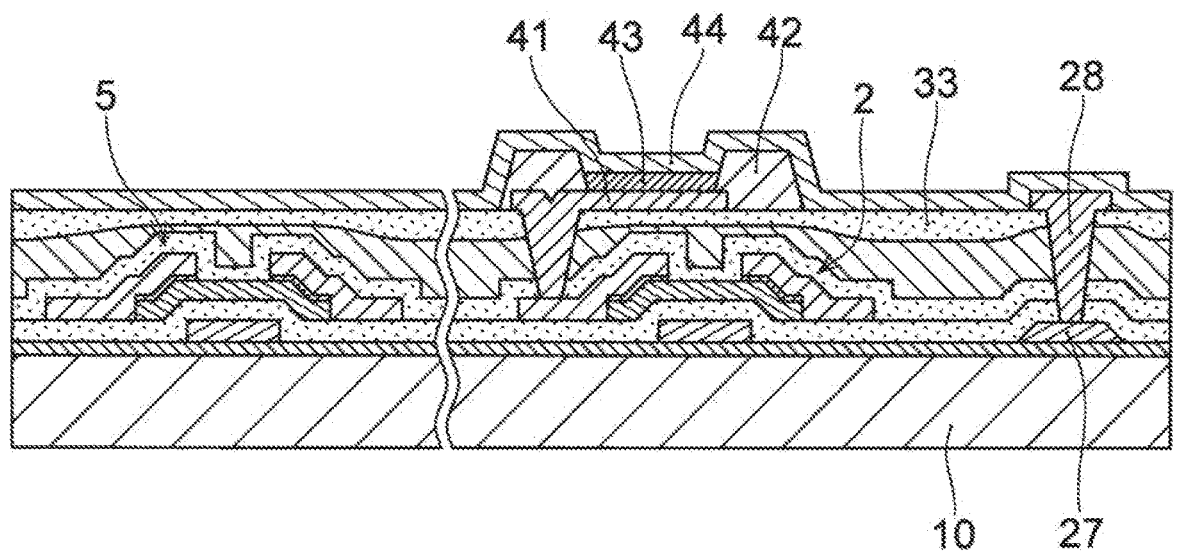
FIG. 9G shows a cross-sectional view showing the manufacturing method for the organic-EL display apparatus according to one embodiment of the present invention.

As shown in FIG. 9G, a second electrode 44 is formed on the organic light-emitting layer 43 (S6 in FIG. 8A). The second electrode 44 is formed by forming a thin-film of Mg—Ag eutectic film by co-vapor deposition, for example. The second electrode 44 is also formed on the cathode contact 28 and is connected to the cathode wiring 27 via the cathode contact 28. The Mg—Ag eutectic film comprises Mg at approximately 90 mass % and Ag at approximately 10 mass %, for example. The second electrode 44 is formed so as to have a thickness of approximately 10 to 20 nm, for example.

An encapsulating layer 46 (see FIG. 2) to protect the second electrode 44 and the organic light-emitting layer 43 from, for example, moisture or oxygen is formed on the second electrode 44. The encapsulating layer 46 is formed by forming an inorganic insulating layer such as $SiO_2$ or $SiN_x$ using plasma CVD, for example. Preferably, the encapsulating layer 46 is formed so that the end portion thereof makes a close contact with an inorganic layer such as the second inorganic insulating layer 33. A good adhesion is obtained, making it possible to prevent penetration of moisture in a further sure manner. The organic-EL display apparatus 1 shown in FIG. 2 can be manufactured by undergoing the above-described processes.

[Summary]

(1) An organic-EL display apparatus according to a first embodiment of the present invention comprises: an organic-EL display panel comprising a substrate and an organic light-emitting element, wherein a plurality of pixel drive circuits to drive a plurality of pixels respectively is provided on a surface of the substrate, the plurality of pixels being arrayed in a matrix along each of a first direction and a second direction being substantially orthogonal to each other, and the organic light-emitting element is provided in each one of the plurality of pixels and connected to any one of the plurality of pixel drive circuits; wherein the organic-EL display panel comprises a signal output circuit to supply a signal substantially simultaneously to each of pixel drive circuits being lined up along the first direction or the second direction in the plurality of pixel drive circuits; the signal output circuit comprises a plurality of thin film transistors and is formed at a periphery of a display region on the surface of the substrate; the thin film transistor comprises a gate electrode, a source electrode, a drain electrode, and a semiconductor layer comprising a region to be a channel between the source electrode and the drain electrode, and the semiconductor layer is formed with amorphous silicon.

The configuration according to (1) makes it possible to suppress display non-uniformity of an organic-EL display apparatus with the structure even making it possible to obtain a sufficient drive capability of a signal output circuit and makes it possible to reduce cost in manufacturing the organic-EL display apparatus.

(2) In the organic-EL display apparatus according to (1) in the above, in at least one of the plurality of thin film transistors, a ratio (W/L) of a channel width (W) of the channel to a channel length (L) of the channel can be greater than or equal to 50 and less than or equal to 500. In that case, a sufficient drive capability to appropriately supply a signal to a pixel drive circuit can be obtained.

(3) In the organic-EL display apparatus according to (1) or (2) in the above, in at least one of the plurality of thin film transistors, a part of a first conductor layer making up the drain electrode and a part of a second conductor layer making up the source electrode can be lined up alternately along a predetermined direction, and the region to be a channel can be sandwiched between the part of the first conductor layer and the part of the second conductor layer. In that case, a thin film transistor that can allow a large current to flow therethrough can be formed in a region having a predetermined size.

(4) In the organic-EL display apparatus according to any one of (1) to (3) in the above, the pixel drive circuit can comprise a current control transistor being configured with a thin film transistor and being connected to the organic light-emitting element, and a semiconductor layer in which a channel is to be formed in the current control transistor can be formed with amorphous silicon. In that case, the backplane of an organic-EL display apparatus can be manufactured easily and inexpensively.

(5) In the organic-EL display apparatus according to (4) in the above, a ratio (W1/L1) of a channel width (W1) of the channel in the current control transistor to a channel length (L1) of the channel in the current control transistor can be greater than or equal to 50 and less than or equal to 500. In that case, a pixel drive circuit having a high drive capability can be obtained.

(6) In the organic-EL display apparatus according to any one of (1) to (5) in the above, the signal output circuit can be a scan driver to supply a scanning line signal of the organic-EL display panel to the pixel drive circuit.

(7) In the organic-EL display apparatus according to (6) in the above, a shift register can be formed by two or more signal output circuits each being the signal output circuit, the two or more signal output circuits being formed so as to line up substantially in parallel with the first direction or the second direction and connected with one another, and the shift register can output the signal, in order, to each of groups each consisting of pixel drive circuits in the plurality of pixel drive circuits, the groups being lined up, in parallel with one another, along a direction in which the two or more signal output circuits are lined up. In that case, the process in a control circuit to generate a timing signal to indicate the output timing of a scanning line signal can be simplified, and/or the number of wirings between the control circuit and an organic-EL display panel can be reduced.

(8) In the organic-EL display apparatus according to any one of (1) to (7) in the above, one or a plurality of the signal output circuits can be formed at each of an edge part of a first side and an edge part of a second side of the substrate having a substantially rectangular shape, the first side and the second side opposing each other, and a first group of the plurality of pixel drive circuits being lined up in one row or column along a direction being substantially orthogonal to the first side and the second side of the substrate can be connected to the signal output circuit being formed at the edge part of the first side and a second group being other than the first group can be connected to the signal output circuit being formed at the edge part of the second side. In that case, load on individual signal output circuits can be reduced.

(9) In the organic-EL display apparatus according to any one of (1) to (8) in the above, the organic-EL display panel can further comprise a planarizing layer to planarize the surface of the substrate by covering at least the pixel drive circuit; the organic light-emitting element can be formed on a surface of the planarizing layer facing to an opposite orientation from the pixel drive circuit, and the surface of the planarizing layer can have an arithmetic average roughness of greater than or equal to 20 nm and less than or equal to 50 nm. In that case, display non-uniformity of an organic-EL display apparatus can be reduced.

(10) A manufacturing method for an organic-EL display apparatus according to a second embodiment of the present invention comprises: forming a plurality of thin film transistors and a wiring on a substrate to form a plurality of pixel drive circuits to drive a plurality of pixels respectively, wherein the plurality of pixels is arrayed in a matrix in an organic-EL display panel; forming an insulating layer to cover at least a surface of the pixel drive circuit, and forming an organic light-emitting element on a surface of the insulating layer so as to be connected to the pixel drive circuit via a metal to penetrate the insulating layer, wherein a plurality of thin film transistors is formed at an edge part of the substrate along with forming of the pixel drive circuit, thereby forming a signal output circuit to supply a signal substantially simultaneously to each of pixel drive circuits being lined up in the plurality of pixel drive circuits; a thin film transistor making up the pixel drive circuit and a thin film transistor making up the signal output circuit are formed by forming a gate electrode, a gate insulating layer, a drain electrode and a source electrode, and a semiconductor layer comprising a region to be a channel between the drain electrode and the source electrode, and the semiconductor layer is formed with amorphous silicon.

The configuration according to (10) makes it possible to manufacture, at low cost, an organic-EL display apparatus having small display non-uniformity, the organic-EL display apparatus comprising a signal output circuit that can have a sufficient drive capability.

(11) In forming the thin film transistor making up the signal output circuit in the manufacturing method for the organic-EL display apparatus according to (10) in the above, the gate electrode, the drain electrode, and the source electrode can be formed such that a ratio (W/L) of a channel width (W) of the channel to a channel length (L) of the channel is brought to be greater than or equal to 50 and less than or equal to 500. In this way, a signal output circuit having a high drive capability can be formed.

(12) In forming the thin film transistor making up the signal output circuit in the manufacturing method for the organic-EL display apparatus according to (10) or (11) in the above, the source electrode and the drain electrode can be formed such that the source electrode and the drain electrode comprise either or both of a recess and a projection in a planar shape and the recess or the projection of the drain electrode and the projection or the recess of the source electrode face each other. In this way, a thin film transistor comprising a channel having a high W/L ratio can be efficiently formed in a limited region on an organic-EL display panel.

(13) In the manufacturing method for the organic-EL display apparatus according to any one of (10) to (12) in the above, the signal output circuit can be a scan driver to supply a scanning line signal of the organic-EL display panel to the pixel drive circuit.

(14) The manufacturing method for the organic-EL display apparatus according to any one of (10) to (13) in the above can further comprise polishing the surface of the insulating layer before forming the organic light-emitting element so as to bring an arithmetic average roughness of the surface of the insulating layer to be greater than or equal to 20 nm and less than or equal to 50 nm. This makes it possible to manufacture an organic-EL display apparatus having small display non-uniformity.

DESCRIPTION OF REFERENCE NUMERALS

1 Organic-EL display apparatus
2 Pixel drive circuit
3 Organic-EL display panel
10 Substrate
20 Current control transistor (first pixel TFT)
21 Semiconductor layer
30 Planarizing layer
31 First inorganic insulating layer
32 Organic insulating layer
33 Second inorganic insulating layer
40 Organic light-emitting element
5, 5a, 5b 5c Signal output circuit
50, 50a to 50m Drive TFT (TFT)
51 Semiconductor layer
52 Gate insulating layer
53 Gate electrode
55 Source electrode
55a Second conductor layer
56 Drain electrode
56a First conductor layer
57 Shift register

The invention claimed is:

1. An organic-EL display apparatus, comprising:
an organic-EL display panel comprising a substrate and an organic light-emitting element, wherein a plurality of pixel drive circuits to drive a plurality of pixels respectively is provided on a surface of the substrate, the plurality of pixels being arrayed in a matrix along each of a first direction and a second direction being substantially orthogonal to each other, and the organic light-emitting element is provided in each one of the plurality of pixels and connected to any one of the plurality of pixel drive circuits; wherein the organic-EL display panel comprises a signal output circuit to supply a signal substantially simultaneously to each of pixel drive circuits being lined up along the first direction or the second direction in the plurality of pixel drive circuits;

the signal output circuit comprises a plurality of thin film transistors and is formed at a periphery of a display region on the surface of the substrate;

the thin film transistor comprises a gate electrode, a source electrode, a drain electrode, and a semiconductor layer comprising a region to be a channel between the source electrode and the drain electrode;

the semiconductor layer is formed with amorphous silicon;

the signal output circuit is covered with a planarizing layer to planarize the surface of the substrate;

the planarizing layer comprises a first inorganic insulating layer being on the signal output circuit, an organic insulating layer being deposited on the first inorganic insulating layer, and a second inorganic insulating layer being deposited on the organic insulating layer; and a surface of the second inorganic insulating layer facing to an opposite orientation from the organic insulating layer has an arithmetic average roughness of greater than or equal to 20 nm and less than or equal to 50 nm.

2. The organic-EL display apparatus according to claim 1, wherein, in at least one of the plurality of thin film transistors, a ratio (W/L) of a channel width (W) of the channel to a channel length (L) of the channel is greater than or equal to 50 and less than or equal to 500.

3. The organic-EL display apparatus according to claim 1, wherein,
in at least one of the plurality of thin film transistors, a part of a first conductor layer making up the drain electrode and a part of a second conductor layer making up the source electrode are lined up alternately along a predetermined direction;

the region to be a channel is sandwiched between the part of the first conductor layer and the part of the second conductor layer;

plural parts each being the part of one of the first conductor layer and the second conductor layer are coupled at respective end portions, thereby the one of the first conductor layer and the second conductor layer has a zig-zag planer shape;

other one of the first conductor layer and the second conductor layer is formed at surroundings of the one of the first conductor layer and the second conductor layer; and the part of the other one of the first conductor layer and the second conductor layer is inserted into a concavity of the zig-zag planer shape.

4. The organic-EL display apparatus according to claim 1, wherein
the pixel drive circuit comprises a current control transistor being configured with a thin film transistor and being connected to the organic light-emitting element; and a semiconductor layer in which a channel is to be formed in the current control transistor is formed with amorphous silicon.

5. The organic-EL display apparatus according to claim 4, wherein a ratio (W1/L1) of a channel width (W1) of the channel in the current control transistor to a channel length (L1) of the channel in the current control transistor is greater than or equal to 50 and less than or equal to 500.

6. The organic-EL display apparatus according to claim 1, wherein
one or a plurality of the signal output circuits is formed at each of an edge part of a first side and an edge part of a second side of the substrate having a substantially rectangular shape, the first side and the second side opposing each other; and
a first group of the plurality of pixel drive circuits being lined up in one row or column along a direction being substantially orthogonal to the first side and the second side of the substrate is connected to the signal output circuit being formed at the edge part of the first side and a second group in the plurality of pixel drive circuits being lined up in the one row or column is connected to the signal output circuit being formed at the edge part of the second side, the second group being other than the first group.

7. The organic-EL display apparatus according to claim 1, wherein
the planarizing layer covers the pixel drive circuit; and
the organic light-emitting element is formed on a surface of the planarizing layer facing to an opposite orientation from the pixel drive circuit.

8. A manufacturing method for an organic-EL display apparatus, the manufacturing method comprising:
forming a plurality of thin film transistors and a wiring on a substrate to form a plurality of pixel drive circuits to drive a plurality of pixels respectively, wherein the plurality of pixels is arrayed in a matrix in an organic-EL display panel;
forming a planarizing layer by forming, in order, a first inorganic insulating layer, an organic insulating layer, and a second inorganic insulating layer so as to cover a surface of the pixel drive circuit;
polishing a surface of the second inorganic insulating layer; and
forming an organic light-emitting element on a surface of the planarizing layer so as to be connected to the pixel drive circuit, wherein
a plurality of thin film transistors is formed at an edge part of the substrate along with forming of the pixel drive circuit, thereby forming a signal output circuit to supply a signal substantially simultaneously to each of pixel drive circuits being lined up in the plurality of pixel drive circuits;
a thin film transistor making up the pixel drive circuit and a thin film transistor making up the signal output circuit are formed by forming a gate electrode, a gate insulating layer, a drain electrode and a source electrode, and a semiconductor layer comprising a region to be a channel between the drain electrode and the source electrode;
the semiconductor layer is formed with amorphous silicon,
the planarizing layer is formed so as to cover the signal output circuit; and
in polishing the surface of the second inorganic insulating layer, the surface of the second inorganic insulating layer is polished so as to have an arithmetic average roughness of greater than or equal to 20 nm and less than or equal to 50 nm.

9. The manufacturing method for the organic-EL display apparatus according to claim 8, wherein
in forming the thin film transistor making up the signal output circuit, the gate electrode, the drain electrode, and the source electrode are formed such that a ratio (W/L) of a channel width (W) of the channel to a channel length (L) of the channel is brought to be greater than or equal to 50 and less than or equal to 500.

* * * * *